US012795918B2

(12) United States Patent
Sharma et al.

(10) Patent No.: US 12,795,918 B2
(45) Date of Patent: Nov. 10, 2026

(54) ELECTRONIC DEVICES INCLUDING PILLARS INCLUDING A MEMORY MATERIAL, AND RELATED MEMORY DEVICES, SYSTEMS, AND METHODS

(71) Applicant: Micron Technology, Inc., Boise, ID (US)

(72) Inventors: Pankaj Sharma, Boise, ID (US); Naveen Kaushik, Boise, ID (US); Sidhartha Gupta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 906 days.

(21) Appl. No.: 17/682,514

(22) Filed: Feb. 28, 2022

(65) Prior Publication Data

US 2023/0276624 A1 Aug. 31, 2023

(51) Int. Cl.

| | |
|---|---|
| ***H10B 43/27*** | (2023.01) |
| ***G11C 16/04*** | (2006.01) |
| ***H10B 43/10*** | (2023.01) |
| ***H10B 43/35*** | (2023.01) |
| ***H10B 43/40*** | (2023.01) |
| ***H10D 30/69*** | (2025.01) |
| ***H10D 64/01*** | (2025.01) |
| ***H10D 64/20*** | (2025.01) |
| ***H10D 64/68*** | (2025.01) |

(52) U.S. Cl.

CPC ......... *H10B 43/27* (2023.02); *G11C 16/0483* (2013.01); *H10B 43/10* (2023.02); *H10B 43/35* (2023.02); *H10B 43/40* (2023.02); *H10D 30/696* (2025.01); *H10D 64/037* (2025.01); *H10D 64/205* (2025.01); *H10D 64/691* (2025.01)

(58) Field of Classification Search

CPC ........ H10B 43/27; H10B 43/10; H10B 43/35; H10B 43/40; G11C 16/0483; H10D 30/696; H10D 64/037; H10D 64/205; H10D 64/691

See application file for complete search history.

(56) References Cited

U.S. PATENT DOCUMENTS

| | | | |
|---|---|---|---|
| 7,611,943 | B2 | 11/2009 | Liu |
| 8,754,533 | B2 | 6/2014 | Or-Bach et al. |
| 9,159,570 | B2 | 10/2015 | Kim et al. |
| 9,214,525 | B2 | 12/2015 | Chen |

(Continued)

OTHER PUBLICATIONS

Chen et al., "A Programmable Facilitating Synapse Device", 2008 International Joint Conference Neural Networks (IJCNN 2008), 6 pages.

(Continued)

*Primary Examiner* — Thanh T Nguyen
(74) *Attorney, Agent, or Firm* — TraskBritt

(57) ABSTRACT

An electronic device comprises a stack comprising tiers of alternating conductive structures and insulative structures, and pillars vertically extending through the stack. The pillars comprise a tunnel dielectric material, a channel material, and an insulative material substantially surrounded by the channel material. The electronic device comprises a memory material horizontally adjacent to the conductive structures without being horizontally adjacent to the insulative structures. Related memory devices, systems, and methods of forming the electronic devices are also described.

22 Claims, 17 Drawing Sheets

(56) References Cited

U.S. PATENT DOCUMENTS

| | | | | |
|---|---|---|---|---|
| 9,391,084 | B2 | 7/2016 | Lue | |
| 9,397,046 | B1 | 7/2016 | Sharangpani et al. | |
| 9,425,299 | B1 | 8/2016 | Rabkin et al. | |
| 9,768,270 | B2 * | 9/2017 | Gunji-Yoneoka | H10D 30/63 |
| 9,923,140 | B2 | 3/2018 | Wu et al. | |
| 10,937,802 | B2 | 3/2021 | Carlson | |
| 10,978,480 | B2 | 4/2021 | Lee et al. | |
| 10,991,721 | B2 | 4/2021 | Rabkin et al. | |
| 11,107,516 | B1 | 8/2021 | Rabkin et al. | |
| 2005/0201150 | A1 | 9/2005 | Wang | |
| 2012/0001252 | A1 | 1/2012 | Alsmeier et al. | |
| 2015/0001460 | A1 * | 1/2015 | Kim | H10N 70/25 257/5 |
| 2015/0340371 | A1 * | 11/2015 | Lue | H10D 89/10 257/324 |
| 2016/0315088 | A1 | 10/2016 | Kang et al. | |
| 2018/0090325 | A1 * | 3/2018 | Yoon | H10D 84/038 |
| 2018/0211969 | A1 * | 7/2018 | Lue | H10B 43/27 |
| 2019/0051661 | A1 | 2/2019 | Carlson | |
| 2020/0203381 | A1 | 6/2020 | Rabkin et al. | |
| 2021/0091204 | A1 | 3/2021 | Rabkin et al. | |
| 2021/0098457 | A1 | 4/2021 | Cheng et al. | |
| 2021/0159167 | A1 | 5/2021 | Tsutsumi et al. | |
| 2021/0202751 | A1 | 7/2021 | Goda et al. | |
| 2023/0066393 | A1 * | 3/2023 | Jiang | H10B 43/20 |
| 2023/0164996 | A1 * | 5/2023 | Rabkin | H10D 30/0413 365/185.18 |

OTHER PUBLICATIONS

Lin et al., "Atomic mechanism of electric dipole formed at high-K: SiO2 interface", J. Appl. Phys. 109, 094502 (2011), 10 pages.

Gokmen et al., "Acceleration of Deep Nerual Network Training with Resistive Cross-Point Devices: Design Considerations", Frontiers in Neuroscience, vol. 10 Article 333, Jul. 2016, 13 pages.

Dunkel et al., "A FeFET based super-low-power ultra-fast embedded NVM technology for 22nm FDSOI and beyond", IEDM17-485, 2017, 4 pages.

Sharma et al., "High Speed Memory Operation in Channel-Last Back-gated Ferroelectric Transistors", IEDM20-391, 2020, 4 pages.

Miyata et al., "Interface Dipole Modulation in HfO2/SiO2 MOS Stack Structures", IEDM18-169, 2018, 4 pages.

Kim et al., "Interfacial Dipole Modulation Device With SiOx Switching Species", Journal of the Electron Devices Society, vol. 9, 2021, 4 pages.

Noriyuki Miyata, "Electric-field-controlled interface dipole modulation for Si-based memory devices", Scientific Reports, (2018) 8:8486, 9 pages.

Shari et al., "Theoretical study of the insulator/insulator interface: Band alignment at the SiO_{2}/HFO_{2} junction", The American Physical Society, Physical Review B 75, 035306 (2007), 11 pages.

* cited by examiner

ELECTRONIC DEVICES INCLUDING PILLARS INCLUDING A MEMORY MATERIAL, AND RELATED MEMORY DEVICES, SYSTEMS, AND METHODS

TECHNICAL FIELD

Embodiments disclosed herein relate to the field of microelectronic device design and fabrication. More particularly, embodiments of the disclosure relate to electronic devices including a memory material (e.g., a charge storage material) of charge storage structures of pillars (e.g., memory pillars), and related memory devices, systems, and methods of forming the electronic devices.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D NAND devices, in which memory cells are stacked vertically on a substrate.

In some 3D NAND devices, the vertical structure may include a charge storage structure (e.g., a "charge trap" structure, which may also be known as a "storage node"). The charge trap structure may include a charge storage material (e.g., a dielectric material) operable to effectively "trap" and store an electrical charge during writing of the electronic device. Erasing the electronic device effectively removes the electrical charge from the charge trap structure.

However, as the memory cells are formed closer together and at smaller dimensions, cell-to-cell coupling and interference between neighboring memory cells (e.g., NAND memory cells) increases, lateral charge migration increases, and program erase and data retention issues arise.

DETAILED DESCRIPTION

Figure 1A:
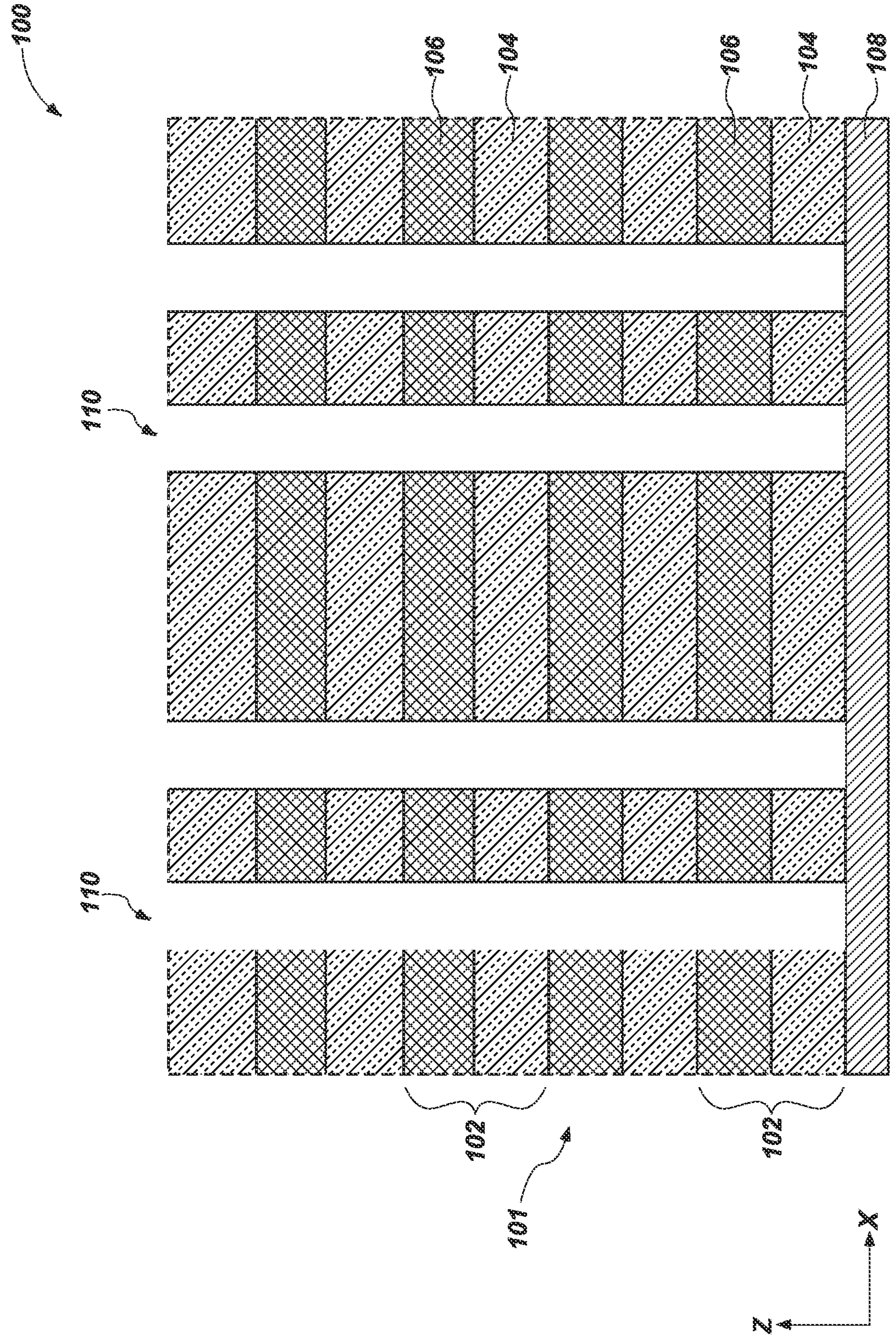
FIGS. 1A through 1K are simplified partial cross-sectional views (FIGS. 1A through 1I) and simplified partial top-down views (FIGS. 1J and 1K) illustrating a method of forming an electronic device, in accordance with embodiments of the disclosure, where the top-down views of FIGS. 1J and 1K are taken along the J-J line and the K-K line, respectively, in FIG. 1E.

An electronic device (e.g., an apparatus, a semiconductor device, a memory device) that includes charge storage structures including a charge storage material is disclosed. Pillars of the electronic device extend vertically through a stack comprising tiers of alternating dielectric materials and conductive materials. Pillar materials, including a tunnel dielectric material, a channel material, and an insulative material (e.g., a fill material, a central insulative material) substantially surrounded by the channel material may extend continuously in the vertical direction. The electronic device comprises a memory material (e.g., a charge storage material, a charge trapping material) horizontally adjacent to the conductive structures without being horizontally adjacent to the insulative structures of the stack. A dielectric blocking material (e.g., a charge blocking material) may be horizontally adjacent to the memory material. In some embodiments, portions of the memory material are vertically adjacent to the insulative structures of the stack and portions of the dielectric blocking material are vertically adjacent to the memory material. For example, the memory material and the dielectric blocking material may be formed (e.g., conformally formed) within cell openings between vertically neighboring insulative structures of the stack.

In some embodiments, the memory material comprises conductive nanoparticles (e.g., crystalline nanoparticles) embedded within a high-k dielectric material comprising one or more of hafnium oxide ($HfO_x$), hafnium zirconium oxide ($HfZrO_x$), and zirconium oxide ($ZrO_x$). Segmented portions of the memory material may be present at levels (e.g., elevations) of the conductive structures of the stack to provide a relatively high density (e.g., the number of memory cells per memory die) memory array within the electronic device compared to that of conventional electronic devices. For example, the conductive nanoparticles may exhibit a relatively high work function (e.g., greater than about 4.5 eV) and a relatively high density of states around the Fermi level. Therefore, a so-called "deep charge trapping well" may be achieved within the segmented portions of the memory material while the channel material and the tunnel dielectric material extend continuously in the vertical direction. The relatively high work function of the conductive nanoparticles may enable a reduced thickness of one or more of the tunnel dielectric material and the dielectric blocking material, which enables the electronic device to operate at a relatively low voltage (e.g., about 5V).

In additional embodiments, a charge storage material comprises a multi-stacked structure comprising one or more regions of a first insulative material, a second insulative material horizontally adjacent to the first insulative material, and a third insulative material horizontally adjacent to the second insulative material. A material composition of the second insulative material differs from a material composition of each of the first insulative material and the third insulative material. The charge storage material may be characterized as an interfacial dipole material that uses interfacial dipole modulation (IDM) in individual portions of a switching material interposed between additional (e.g., differing) materials. For example, the switching material (e.g., a silicon oxide material) of the second insulative material may be interposed between additional materials (e.g., additional oxide materials) of the first insulative material and the third insulative material. As current flows through the charge storage material during various memory operations (e.g., program operations, erase operations), interfacial dipoles may be generated along interfaces between the differing materials of the charge storage material as a result of a difference in a number (e.g., quantity) of oxygen atoms per unit area between adjacent materials. Thus, the various memory operations may be conducted by switching a direction of the interfacial dipoles along the interfaces between individual portions of the materials of the charge storage material, which enables the electronic device to operate at a relatively low voltage (e.g., about 5V). Further, the channel material of the pillars, as well as one or more (e.g., each) of the materials of the charge storage material, may comprise amorphous materials. Accordingly, high-temperature annealing processes are not utilized, which may facilitate improved performance, reliability, and durability of the electronic device.

Further, at least some memory cells of strings of memory cells of the pillars may be configured as multi-level cells (MLC) (e.g., storing two or more bits per cell). The presence of the memory material (e.g., a charge trapping material) or, alternatively, the charge storage material (e.g., the IDM material) adjacent to the tunnel dielectric material, and within the recessed regions of the conductive materials within the cell openings does not negatively affect electrical performance properties. For example, presence of the memory material and the charge storage material does not negatively affect wordline resistance, cell-to-cell coupling between the memory cells that are controlled by vertically neighboring wordlines, program and erase performance, data retention, etc., of the electronic device.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a hafnium-doped silicon oxide ($HfSiO_x$), a hafnium aluminum oxide ($HfAlO_x$), a hafnium zirconium oxide ($HfZrO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the term "amorphous," when referring to a material, means and refers to a material having a substantially noncrystalline structure.

As used herein, the term "high-k dielectric material" means and includes a dielectric oxide material having a dielectric constant greater than the dielectric constant of silicon dioxide ($SiO_2$). The high-k dielectric material may include a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium zirconium oxide, hafnium silicate, a combination thereof, or a combination of one or more of the listed high-k dielectric materials with silicon oxide.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "air gap" means a volume extending into or through another region or material, or between regions or materials, leaving a void in that other region or material, or between regions or materials, that is empty of a solid and/or liquid material. An "air gap" is not necessarily empty of a gaseous material (e.g., air, oxygen, nitrogen, argon, helium, or a combination thereof) and does not necessarily contain "air." An "air gap" may be, but is not necessarily, a void (e.g., an unfilled volume, a vacuum).

Figure 1B:
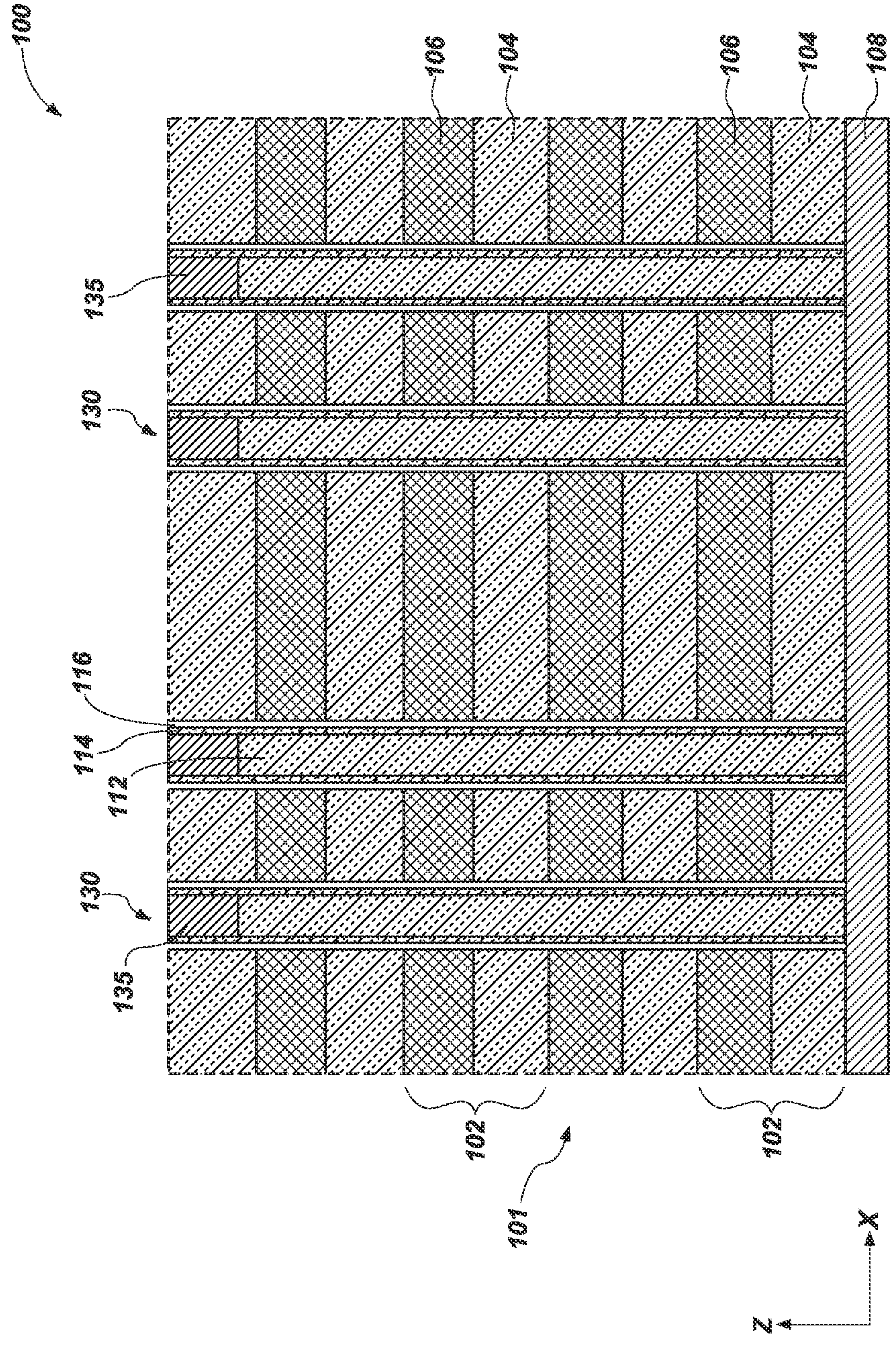
Figure 1C:
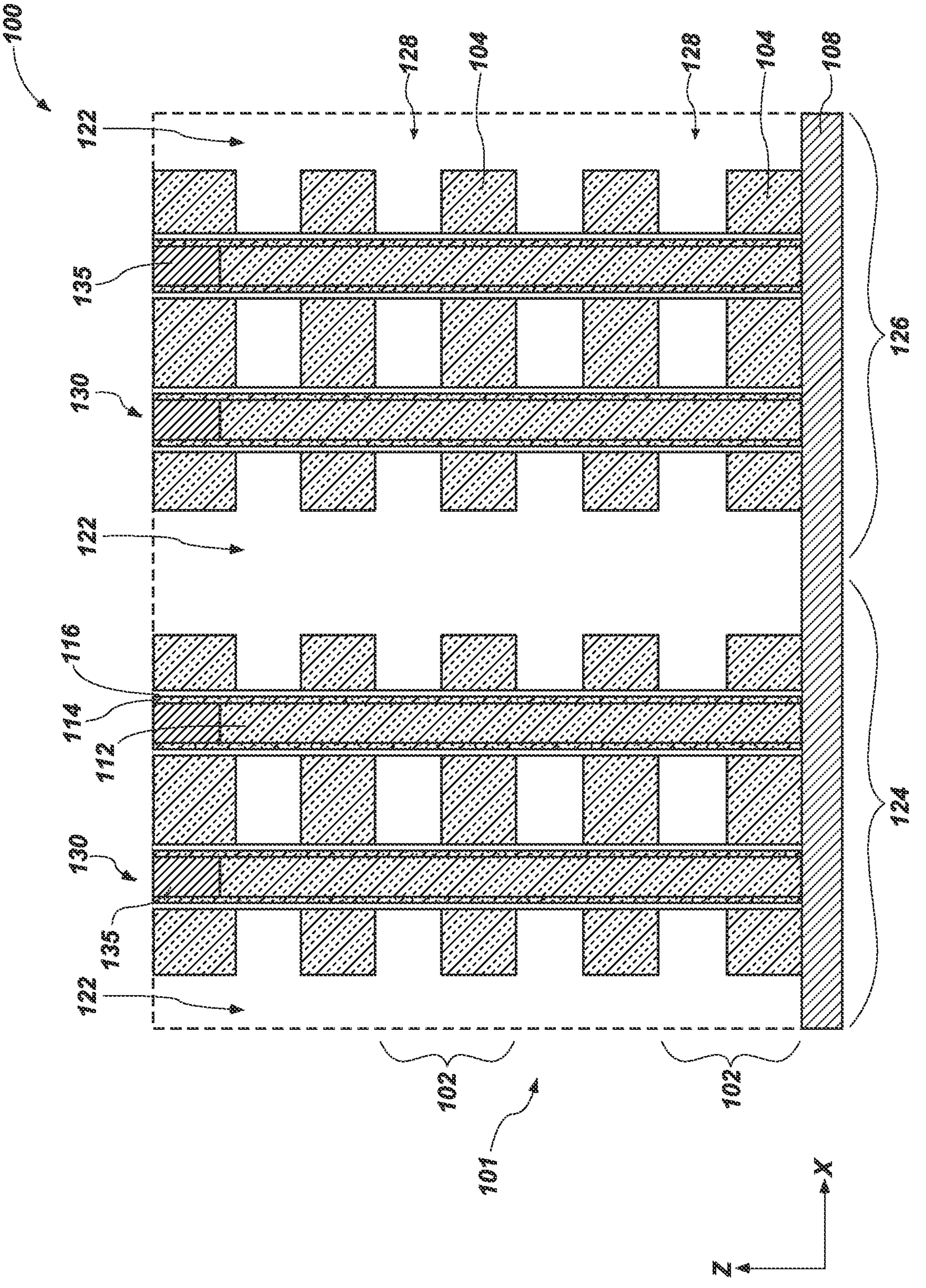
Figure 1D:
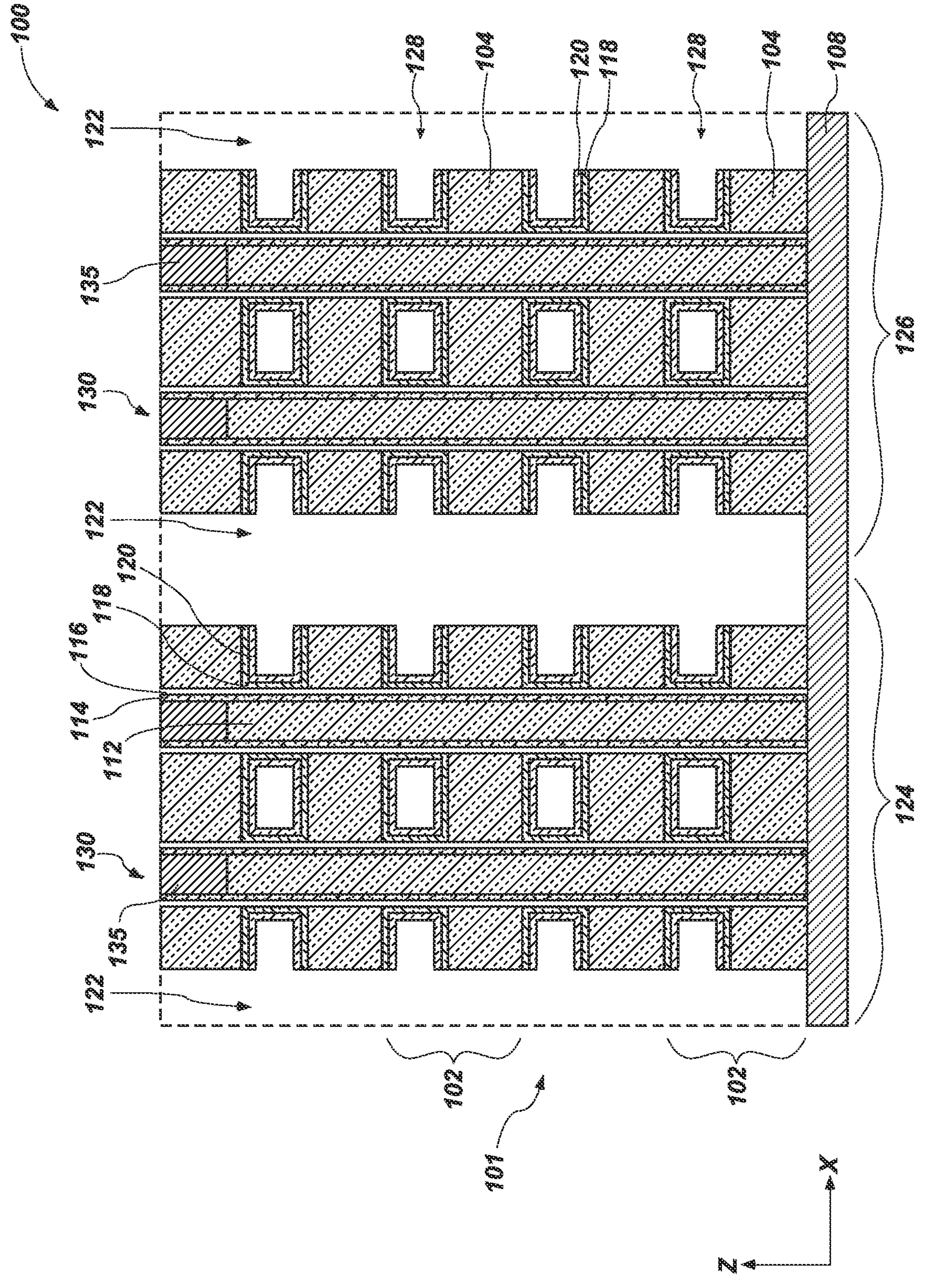
Figure 1E:
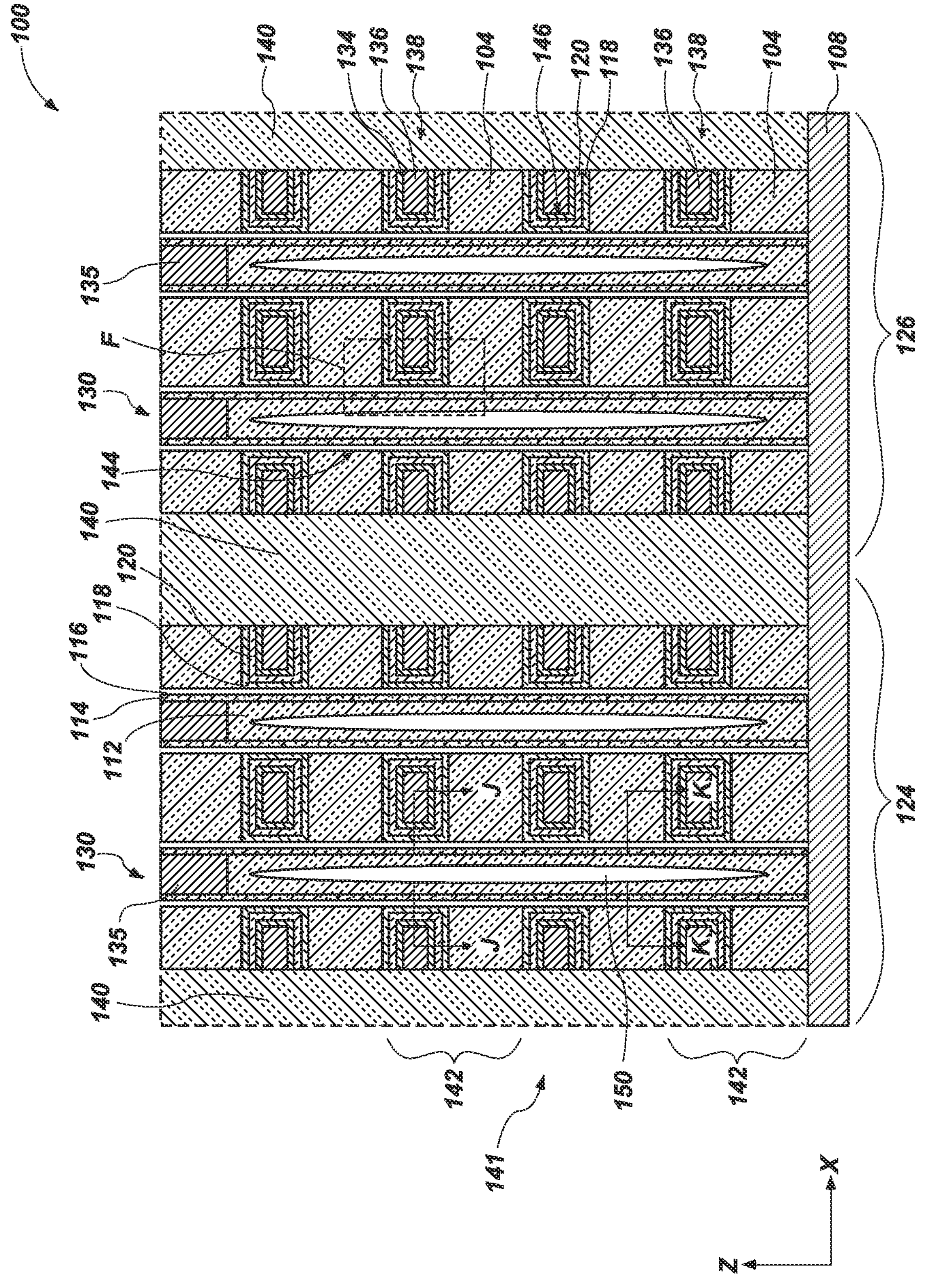
Figure 1F:
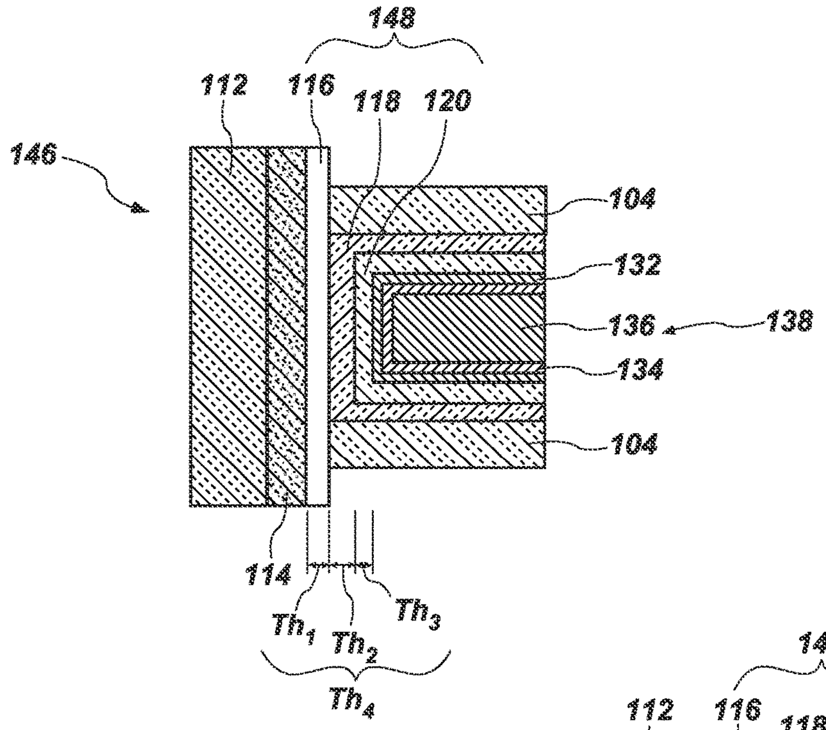
Figure 1G:
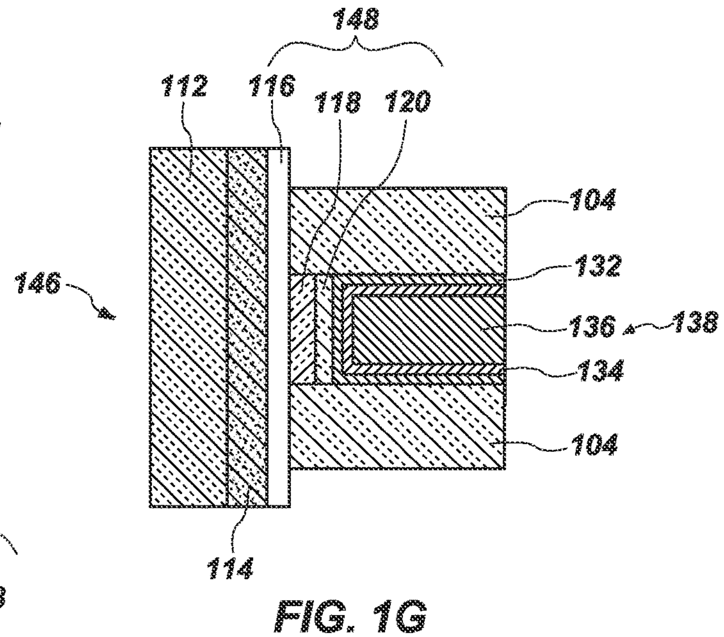
Figure 1H:
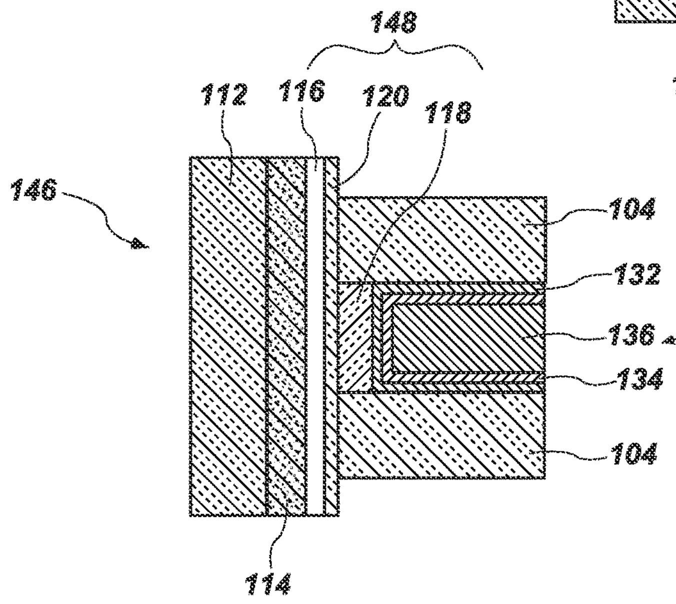
Figure 1I:
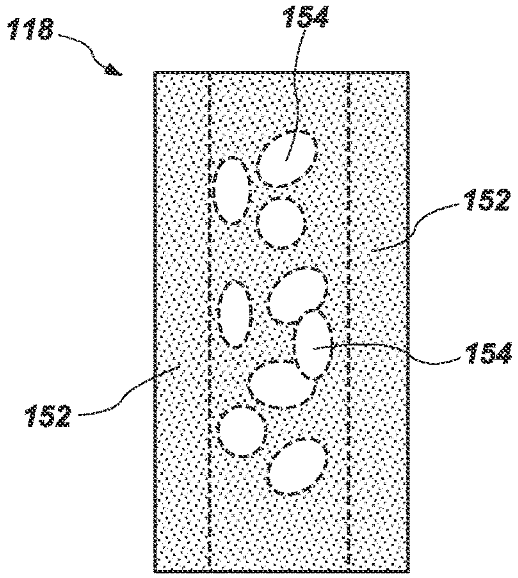
Figure 1J:
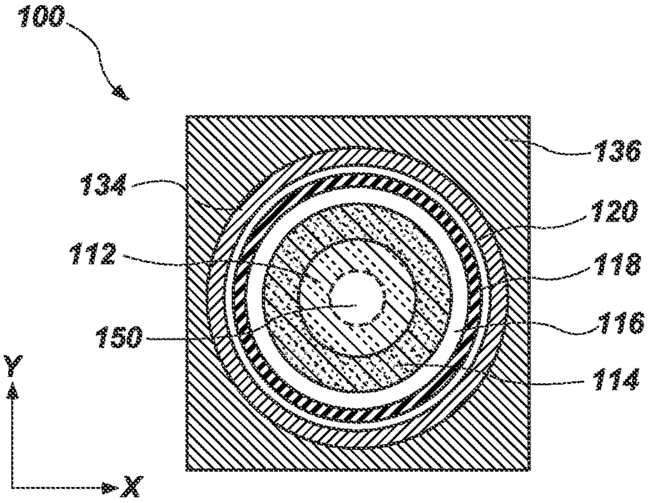
Figure 1K:
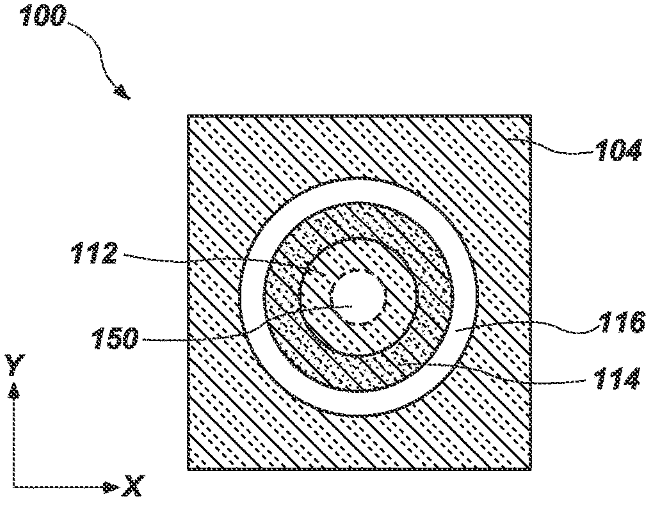

FIGS. 1A through 1K illustrate a method of forming an electronic device (e.g., a memory device, such as a 3D NAND Flash memory device), in accordance with embodiments of the disclosure, of which FIGS. 1F through 1I are enlarged portions of FIG. 1E. FIGS. 1J and 1K are simplified partial top-down views taken along the J-J line and the K-K line, respectively, in FIG. 1E. Referring to FIG. 1A, an electronic device 100 may be formed to include a stack 101 including a vertically (e.g., in the Z-direction) alternating sequence of insulative structures 104 and additional insulative structures 106 arranged in tiers 102. Each of the tiers 102 may include at least one of the insulative structures 104 directly vertically adjacent at least one of the additional insulative structures 106.

A number (e.g., quantity) of tiers 102 of the stack 101 may be within a range from about 32 of the tiers 102 to about 256 of the tiers 102. In some embodiments, the stack 101 includes about 128 of the tiers 102. However, the disclosure is not so limited, and the stack 101 may include a different number of the tiers 102. The stack 101 may comprise at least one (e.g., one, two, more than two) deck structure vertically overlying a source 108. For example, the stack 101 may comprise a single deck structure or a dual deck structure (not shown) for a 3D memory device (e.g., a 3D NAND Flash memory device).

The insulative structures 104 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 104 are formed of and include $SiO_2$.

The additional insulative structures 106 may be formed of and include an insulative material that is different than, and exhibits an etch selectivity with respect to, the insulative structures 104. The additional insulative structures 106 may be formed of and include at least one dielectric nitride material (e.g., $SiN_y$) or at least one oxynitride material (e.g., $SiO_xN_y$). In some embodiments, the additional insulative structures 106 comprise $Si_3N_4$.

The stack 101 may be formed on or over the source 108 (e.g., a source tier, a source plate). The source 108 may be formed of and include a conductive material such as, for example, a semiconductor material (e.g., polysilicon) doped with at least one p-type dopant (e.g., one or more of boron, aluminum, and gallium) or at least one n-type dopant (e.g., arsenic, phosphorous, antimony). While not illustrated in FIG. 1A, complementary metal-oxide-semiconductor (CMOS) circuitry may, for example, be present below the source 108, as described below with reference to FIG. 3.

As shown in FIG. 1A, openings 110 may be formed through the stack 101 to, for example, expose a portion of the source 108. The openings 110 may subsequently be filled with one or more materials to form pillars of the electronic device 100, as described in further detail below. The openings 110 may have a horizontal dimension (e.g., diameter) within a range from about 60 nm to about 120 nm, such as from about 60 nm to about 80 nm, from about 80 nm to about 100 nm, or from about 100 nm to about 120 nm. In some embodiments, the horizontal dimension is about 100 nm. However, the disclosure is not so limited and the horizontal dimension may be different than those described.

Referring to FIG. 1B, pillars 130 of materials may be formed to vertically extend (e.g., in the Z-direction) through the stack 101. The materials of the pillars 130 may be employed to form memory cells for a memory device following subsequent processing of the electronic device 100. The pillars 130 may each comprise an insulative material 112, a channel material 114 horizontally adjacent to the insulative material 112, and a tunnel dielectric material 116 (also referred to as a "tunneling dielectric material") horizontally adjacent to the channel material 114. The channel material 114 may be horizontally interposed between the insulative material 112 and the tunnel dielectric material 116. The tunnel dielectric material 116 may be horizontally adjacent to (e.g., directly adjacent to) the insulative structures 104 and the additional insulative structures 106 of the tiers 102 of the stack 101. In other words, the tunnel dielectric material 116 may be formed (e.g., conformally formed) directly on exposed side surfaces of the insulative structures 104 and the additional insulative structures 106 within the openings 110 (FIG. 1A), without additional materials being formed therebetween. The tunnel dielectric material 116 may be substantially continuous along a height of the pillars 130. As will be described herein, additional materials (e.g., memory material, dielectric blocking material) may subsequently be formed horizontally adjacent to portions of the tunnel dielectric material 116 (e.g., external to the openings 110) for formation of the memory cells of the memory device (see FIG. 1D).

The insulative material 112 (e.g., a fill material, a central insulative material) may be formed of and include at least one insulative material. In some embodiments, the insulative material 112 is formed of and includes a dielectric oxide material, such as $SiO_2$. In addition, a portion of the insulative material 112 may be replaced (e.g., substantially entirely replaced) with or, alternatively, supplemented with air gaps, as described in further detail below.

The channel material 114 may be formed of and include one or more of at least one semiconductor material (at least one elemental semiconductor material, such as polycrystalline silicon, at least one III-V compound semiconductor material, at least one II-VI compound semiconductor material, at least one organic semiconductor material, GaAs, InP, GaP, GaN, other semiconductor materials), and at least one oxide semiconductor material. In some embodiments, the channel material 114 may include amorphous silicon or polycrystalline silicon. In other embodiments, the channel material 114 may include a doped semiconductor material.

In additional embodiments, the channel material 114 may comprise an oxide semiconductor material, such as zinc tin oxide ($Zn_xSn_yO$, commonly referred to as "ZTO"), indium zinc oxide ($In_xZn_yO$, commonly referred to as "IZO"), indium tin oxide ($In_xSn_yO_z$, commonly referred to as "ITO"), zinc oxide ($Zn_xO$), indium gallium zinc oxide ($In_xGa_yZn_zO$, commonly referred to as "IGZO") (e.g., amorphous IGZO), indium gallium silicon oxide ($In_xGa_ySi_zO_a$, commonly referred to as "IGSO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), indium zinc oxide ($In_xZn_yO$), indium gallium zinc oxide ($In_xGa_yZn_zO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), indium aluminum gallium oxide ($In_xAl_yGa_zO_a$), indium aluminum gallium nitride ($In_xAl_yGa_zN$), silicon indium zinc oxide ($Si_xIn_yZn_zO$), zinc tin oxide ($Zn_xSn_yO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), indium gallium silicon oxide ($In_xGa_ySi_zO$), or a similar material. Formulae including at least one of "x", "y", "z", and "a" above (e.g., $Zn_xSn_yO$, $In_xZn_yO$, $In_xGa_yZn_zO$, $In_xGa_ySi_zO$, $Al_xSn_yIn_zZn_aO$) represent a composite material that contains an average ratio of "x" atoms of one element, "y" atoms of another element (if any), "z" atoms of an additional element (if any), and "a" atoms of a further element (if any) for every one atom of oxygen (O). As the formulae are representative of relative atomic ratios and not strict chemical structure, the channel material 114 may comprise a stoichiometric compound or a non-stoichiometric compound, and the values of "x", "y", "z", and "a" may be integers or may be non-integers. As used herein, the term "non-stoichiometric compound" means and includes a chemical compound with an elemental composition that cannot be represented by a ratio of well-defined natural numbers and is in violation of the law of definite proportions. The channel material 114 may include stoichiometric variations of the listed materials, and/or combinations of materials (e.g., $InGaZnO_3$, $In_2Zn_3O_6$, etc.). In some embodiments, the channel material 114 includes an amorphous material (e.g., amorphous IGZO). The channel material 114 may be substantially homogeneous, or the channel material 114 may be heterogeneous. For example, the channel material 114 may include a first channel material and a second, different channel material inwardly horizontally adjacent to the first channel material.

The tunnel dielectric material 116 may be formed of and include a dielectric material through which charge tunneling may be performed under suitable electrical bias conditions, such as through hot-carrier injection or by Fowler-Nordheim tunneling induced charge transfer. By way of non-limiting example, the tunnel dielectric material 116 may be formed of and include one or more of a dielectric oxide material, a dielectric nitride material, and a dielectric oxynitride material. In some embodiments, the tunnel dielectric material 116 comprises Sift. In other embodiments, the tunnel dielectric material 116 comprises $SiO_xN_y$, wherein "x" and "y" represent a material that contains an average ratio of "x" atoms of one element and "y" atoms of another element for every one atom of another element. In yet other embodiments, the tunnel dielectric material 116 comprises $HfSiO_x$.

With continued reference to FIG. 1B, conductive contact structures 135 (e.g., conductive plug structures) may be formed in electrical communication with the channel material 114 of the pillars 130. For example, in some embodiments, a portion of the insulative material 112 within the pillars 130 may be selectively removed to form a recessed portion in each of the pillars 130. After selectively removing the insulative material 112, a conductive material of the conductive contact structures 135 may be formed within the recess of each pillar 130 and in electrical communication with the channel material 114.

In other embodiments, the insulative material 112 of each pillar 130 may not be recessed. In some such embodiments, a mask material, such as a dielectric material may be formed over the stack 101 of the electronic device 100. Openings may be formed in the dielectric material at locations corresponding to the locations of the pillars 130 to expose upper (e.g., in the Z-direction) portions of the channel material 114. The conductive contact structures 135 may be formed in the openings and in electrical communication with the channel material 114. In some embodiments, an additional channel material (e.g., such as a liner) is formed within the openings and in electrical communication with the channel material 114 and the conductive contact structures 135 are formed in remaining portions of the openings and in electrical communication with the additional channel material. The conductive contact structures 135 may be in electrical communication with, for example, conductive lines for providing access to strings of memory cells formed from the pillars 130.

Referring to FIG. 1C, slots 122, which may also be referred to as "slits" or "replacement gate slots" may be formed through the stack 101. The slots 122 may be formed to vertically extend completely through the stack 101 and expose surfaces of the source 108. The slots 122 may be formed by, for example, exposing the electronic device 100 to one or more etchants to remove portions of the insulative structures 104 and the additional insulative structures 106 (FIG. 1B) of the stack 101. The slots 122 may divide the electronic device 100 into separate blocks, such as a first block 124 and a second block 126. As shown in FIG. 1C, the first block 124 and the second block 126 may each include a plurality (e.g., multiple, more than one) of the pillars 130.

After forming the slots 122, the additional insulative structures 106 (FIG. 1B) of the stack 101 may be at least partially (e.g., substantially) removed through the slots 122 through a so-called "replacement gate" or "gate last" process to form cell openings 128. By way of non-limiting example, the additional insulative structures 106 may be at least partially removed by exposing the additional insulative structures 106 to at least one wet etchant comprising one or more of phosphoric acid, sulfuric acid, hydrochloric acid, nitric acid, or another etch chemistry. The additional insulative structures 106 may be at least partially removed by exposing the additional insulative structures 106 to a so-called "wet nitride strip" comprising phosphoric acid.

Referring to FIG. 1D, following formation of the cell openings 128, a memory material 118 (e.g., a charge storage material, a charge trapping material) may be formed between vertically neighboring insulative structures 104 at locations corresponding to the previous locations of the additional insulative structures 106 (FIG. 1B). A dielectric blocking material 120 (also referred to as a "charge blocking material") may be formed adjacent to the memory material 118 within the cell openings 128.

The memory material 118 may be formed adjacent to (e.g., vertically adjacent to) the insulative structures 104 and adjacent to (e.g., horizontally adjacent to) the tunnel dielectric material 116 within the cell openings 128 and within portions of the slots 122. The memory material 118 may be formed using one or more conformal deposition processes, such as one or more of a conventional conformal CVD process or a conventional ALD process. Since the memory material 118 is conformally formed, a portion of the cell openings 128 within the stack 101 may remain substantially free of the memory material 118. Accordingly, the memory material 118 is formed in the cell openings 128 without fully filling the cell openings 128 of the stack 101. The memory material 118 may be formed adjacent to (e.g., directly adjacent to) exposed surfaces (e.g., upper surfaces, lower surfaces) of the insulative structures 104 and adjacent to (e.g., directly adjacent to) exposed surfaces (e.g., side surfaces) of the tunnel dielectric material 116 of the pillars 130.

The dielectric blocking material 120 may be formed adjacent to (e.g., vertically adjacent to, horizontally adjacent to) the memory material 118 within the cell openings 128 and within portions of the slots 122. The dielectric blocking material 120 may be formed using one or more conformal deposition processes, such as one or more of a conventional conformal CVD process or a conventional ALD process. Since the dielectric blocking material 120 is conformally formed, a portion (e.g., a central portion) of the cell openings 128 within the stack 101 may remain substantially free of the dielectric blocking material 120. Accordingly, the dielectric blocking material 120 is formed in the cell openings 128 without fully filling the cell openings 128 of the stack 101. The dielectric blocking material 120 may be formed adjacent to (e.g., directly adjacent to) exposed surfaces (e.g., upper surfaces, lower surfaces, side surfaces) of the memory material 118. The dielectric blocking material 120 may be isolated from the insulative structures 104 without being in contact therewith. In other words, the memory material 118 separates the dielectric blocking material 120 from the insulative structures 104, such that the dielectric blocking material 120 does not directly contact the insulative structures 104.

Portions of one or more of the memory material 118 and the dielectric blocking material 120 within the slots 122 may be selectively removed, such as by etching, to remove the memory material 118 and the dielectric blocking material 120 from side surfaces of the insulative structures 104 defining the slots 122. Remaining portions of the memory material 118 and the dielectric blocking material 120 extend vertically along exposed side surfaces of the tunnel dielectric material 116 within the cell openings 128. As shown in FIG. 1D, remaining portions of the memory material 118 and the dielectric blocking material 120 may also extend horizontally along the upper surfaces and the lower surfaces of the insulative structures 104 within the cell openings 128.

The memory material 118 may comprise one or more materials of a charge storage material (e.g., charge trapping material, a conductive material) formulated and configured to store charge received from the channel material 114 during operation of the electronic device 100. By way of non-limiting example, the memory material 118 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), and a semiconductive material (e.g., a polycrystalline semiconductive material, an amorphous semiconductor material). In some embodiments, the memory material 118 comprises $Si_3N_4$. In other embodiments, the memory material 118 comprises conductive nanoparticles (e.g., ruthenium nanoparticles, crystalline nanoparticles, metal dots) embedded within an insulative material (e.g., hafnium oxide ($HfO_x$), hafnium zirconium oxide ($HfZrO_x$), zirconium oxide ($ZrO_x$)), as described in greater detail with reference to FIG. 1I.

The dielectric blocking material 120 may be formed of and include a dielectric material such as, for example, one or more of a dielectric oxide (e.g., $SiO_x$), a dielectric nitride (e.g., $SiN_y$), and a dielectric oxynitride (e.g., $SiO_xN_y$), or another dielectric material. In some embodiments, the dielectric blocking material 120 comprises $Al_2O_3$. In other embodiments, the dielectric blocking material 120 comprises $HfAlO_3$. In yet other embodiments, the dielectric blocking material 120 comprises $AlSiO_x$.

Referring to FIG. 1E, following formation of the memory material 118 and the dielectric blocking material 120, a conductive liner material 134 may, optionally, be formed in the cell openings 128 (FIG. 1D). For example, the conductive liner material 134 may be formed adjacent to (e.g., directly adjacent to) one or more of the insulative structures 104 and the dielectric blocking material 120. In other embodiments, a dielectric barrier material (e.g., a dielectric barrier material 132 (FIG. 1F)) may, optionally, be formed adjacent to the conductive liner material 134 within the cell openings 128, as described in greater detail below. The conductive liner material 134 may be formed of and include a seed material from which subsequently formed conductive materials of conductive tiers may be formed. The conductive liner material 134 may be formed of and include, for example, a metal (e.g., titanium, tantalum), a metal nitride (e.g., tungsten nitride, titanium nitride, tantalum nitride), or another material. In some embodiments, the conductive liner material 134 comprises titanium nitride.

Conductive structures 136 may be formed between vertically neighboring insulative structures 104 at locations corresponding to the previous locations of the additional insulative structures 106 (FIG. 1B). For example, a conductive material of the conductive structures 136 may be formed adjacent to the conductive liner material 134, if present, and within central portions of the cell openings 128 (FIG. 1D). The conductive structures 136 may be formed of and include any conductive material including, but not limited to, n-doped polysilicon, p-doped polysilicon, undoped polysilicon, or a metal. In some embodiments, the conductive structures 136 are formed of and include n-doped polysilicon. In other embodiments, the conductive structures 136 are formed of and include tungsten. In yet other embodiments, the conductive structures 136 are formed of and include one or more of titanium, ruthenium, aluminum, and molybdenum.

With continued reference to FIG. 1E, the conductive material of the conductive structures 136 may be formed in the cell openings 128 (FIG. 1D) proximal to the slots 122 (FIG. 1D), between the pillars 130, and within portions of the slots 122. For example, the conductive structures 136 may be formed adjacent to (e.g., vertically adjacent to, horizontally adjacent to) the memory material 118 and the dielectric blocking material 120 within the cell openings 128. The conductive structures 136 may substantially completely fill the cell openings 128 so as to substantially fully extend between exposed upper and lower surfaces of the dielectric blocking material 120 or, alternatively, between exposed upper and lower surfaces of the conductive liner material 134, if present. The conductive material of the conductive structures 136 may be formed using one or more conventional non-conformal deposition processes, such as one or more of a conventional PVD process (e.g., a conventional radio frequency PVD (RFPVD) process), or a conventional non-conformal CVD process.

Accordingly, the memory material 118 may be horizontally interposed between the tunnel dielectric material 116 of the pillars 130 and the dielectric blocking material 120, and the dielectric blocking material 120 may be horizontally interposed between the memory material 118 and the conductive structures 136. In other words, one or more (e.g., each) of the memory material 118 and dielectric blocking material 120 may individually be horizontally adjacent to the conductive structures 136 without being horizontally adjacent to the insulative structures 104. Thus, vertical portions of the memory material 118 and the dielectric blocking material 120 may be horizontally adjacent to the conductive structures 136 proximal the pillars 130 and distal to the slots 122 (FIG. 1D), without vertical portions of the memory material 118 and the dielectric blocking material 120 being horizontally adjacent to the conductive structures 136 proximal the slots 122.

In some embodiments, the memory material 118 may be vertically interposed between the insulative structures 104 and the dielectric blocking material 120, and the dielectric blocking material 120 may be vertically interposed between the memory material 118 and the conductive structures 136. The memory material 118 may include upper portions and lower portions separated from one another by the conductive structures 136, and the dielectric blocking material 120 may include upper portions and lower portions separated from one another by the conductive structures 136. One or more additional materials (e.g., the dielectric barrier material 132 (FIG. 1F), the conductive liner material 134) may be interposed (e.g., horizontally interposed, vertically interposed) between the dielectric blocking material 120 and the conductive structures 136. Alternatively, the conductive structures 136 may be formed adjacent to (e.g., directly adjacent to) exposed surfaces of the insulative structures 104. Portions of the conductive material of the conductive structures 136 within the slots 122 (FIG. 1D) may be selectively removed, such as by etching, to isolate the conductive structures 136 from one another.

Formation of the conductive structures 136 may form conductive levels 138 vertically interposed between vertically neighboring insulative structures 104. The conductive levels 138 comprise the conductive structures 136, the memory material 118, the dielectric blocking material 120, and one or more (e.g., each) of the dielectric barrier material 132 (FIG. 1F) and the conductive liner material 134. In some embodiments, the conductive levels 138 are located within vertical boundaries defined by vertically neighboring insulative structures 104. Formation of the conductive structures 136 results in formation of tiers 142 of the insulative structures 104 and the conductive structures 136 of the conductive levels 138, and strings 144 of memory cells 146 vertically extending through a stack 141 (e.g., a conductive stack). The electronic device 100 may be configured as a single-level cell (SLC) memory device. In additional embodiments, the electronic device 100 may be configured to attain higher levels of storage capacity by including multi-level cells (MLC), triple-level cells (TLC), quad-level cells (QLC), etc., or combinations thereof in which the memory cell has multiple levels that enable more bits (e.g., data values) to be stored. For example, in a single-level cell (SLC), two states can exist such that only one bit per cell may be stored. MLC may be configured to store two bits per cell, TLC may be configured to store three bits per cell, QLC may be configured to store four bits per cell, and so on.

With continued reference to FIG. 1E, the conductive structures 136 may function as word lines (e.g., local word lines) for the strings 144 of the memory cells 146. In some embodiments, the conductive structures 136 of one or more (e.g., from one to five) vertically lower tiers 142 (e.g., a vertically lowest tier 142) may be employed as select gate structures (e.g., select gate source (SGS) structures). Furthermore, the conductive structures 136 of one or more (e.g., from one to five) vertically upper tiers 142 (e.g., a vertically highest tier 142) may be employed as select gate structures (e.g., select gate drain (SGD) structures). In other embodiments, the stack 101 includes a lower portion including the conductive structures 136 laterally adjacent to the pillars 130 and an upper portion including the conductive structures 136 laterally adjacent to contact structures located between conductive lines (e.g., data lines) and the conductive contact structures 135 of the pillars 130 and separated from the lower portion of the stack 101 by another material (e.g., a barrier material). According, the conductive structures 136 within the upper portion may function as the select gate structures (e.g., de-integrated SGDs).

Following formation of the conductive structures 136, the slots 122 (FIG. 1D) may be substantially filled with an insulative material 140 (e.g., a dielectric material). The insulative material 140 may extend through the stack 141 and be adjacent to (e.g., directly on) exposed upper surfaces of the source 108. In addition, the insulative material 140 may be located between neighboring blocks (e.g., the first block 124 and the second block 126) at locations corresponding to the slots 122. A material composition of the insulative material 140 may substantially the same as a material composition of the insulative structures 104 of the stack 141, or the material composition of the insulative material 140 may be different than the material composition of the insulative structures 104. In some embodiments, the insulative material 140 is formed of and includes $SiO_2$.

As shown in FIG. 1E, one or more air gaps 150 (e.g., voids, unfilled volumes) may, optionally, be present in the insulative material 112 of the pillars 130. For example, the air gaps 150 may be formed within a central portion of the pillars 130 and be substantially surrounded by the insulative material 112. Alternatively, the air gaps 150 may be formed within the central portion of the pillars 130 in place of the insulative material 112, such that the air gaps 150 are adjacent to the channel material 114. Accordingly, at least some of the air gaps 150 are horizontally interposed between portions of the channel material 114 of the pillars 130. The air gaps 150 may be in direct vertical alignment with the conductive contact structures 135. For simplicity and ease of understanding the disclosure, the air gaps 150 are illustrated at the process stage depicted in FIG. 1E. However, the air gaps 150 may be formed at the process stage depicted in FIG. 1B (e.g., during formation of the pillars 130 and prior to formation of the conductive contact structures 135). If no air gaps 150 are present, the insulative material 112 may substantially fill the openings 110 (FIG. 1A) in which the pillars 130 are formed.

Intersections of the conductive structures 136, the memory material 118, the dielectric blocking material 120, and the pillars 130 may form individual memory cells 146 of the strings 144 of the memory cells 146. FIG. 1F illustrates an enlarged portion of box F of FIG. 1E and illustrates a memory cell 146, in accordance with embodiments of the disclosure. With reference to FIG. 1F, the memory cells 146 may each include the channel material 114 horizontally neighboring the insulative material 112, the tunnel dielectric material 116 horizontally neighboring the channel material 114, the memory material 118 horizontally neighboring the tunnel dielectric material 116, the dielectric blocking material 120 horizontally neighboring the memory material 118, and the conductive structures 136 of the conductive levels 138 horizontally neighboring the dielectric blocking material 120.

The tunnel dielectric material 116, the memory material 118, and the dielectric blocking material 120 together may comprise a charge storage structure 148 configured to trap a charge, such as, for example, an oxide-nitride-oxide (ONO) structure. In the embodiment of FIGS. 1A through 1K, the charge storage structure 148 may be characterized as a so-called "charge trapping structure." In some embodiments, the tunnel dielectric material 116 comprises Sift, the memory material 118 comprises $Si_3N_4$, and the dielectric blocking material 120 comprises Sift. In other embodiments, the tunnel dielectric material 116 comprises $HfSiO_2$, the memory material 118 comprises ruthenium nanoparticles embedded within $HfO_x$, and the dielectric blocking material 120 comprises $Al_2O_3$. However, the disclosure is not so limited, and the charge storage structure 148 may include any combination of the listed materials.

The dielectric barrier material 132 (e.g., a high-k dielectric material) may, optionally, be formed adjacent to (e.g., directly adjacent to) the dielectric blocking material 120 within the cell openings 128 (FIG. 1D), as illustrated in FIG. 1F. The dielectric barrier material 132 may be conformally formed by conventional techniques. The dielectric barrier material 132 comprises $Al_2O_3$. Alternatively, the dielectric barrier material 132 is formed from hafnium-doped silicon dioxide ($HfSiO_2$), where the ratio of hafnium to silicon is adjusted to achieve a desired etch selectivity of the dielectric barrier material 132. The dielectric barrier material 132 may be selected to exhibit high etch selectivity relative to the insulative material of the insulative structures 104 of the tiers 142.

The conductive liner material 134 may be formed adjacent to (e.g., directly adjacent to) the dielectric barrier material 132, if present, within the cell openings 128 (FIG. 1D). In other embodiments, the dielectric barrier material 132 is in direct contact with the conductive structures 136, and the electronic device 100 is substantially (e.g., entirely) devoid of the conductive liner material 134 between the dielectric barrier material 132 and the conductive structures 136. In other words, each of the tiers 142 may lack the conductive liner material 134 between the insulative structures 104 and the conductive structures 136. In additional embodiments, the dielectric barrier material 132 is absent from the cell openings 128 and the conductive liner material 134 is adjacent to (e.g., directly adjacent to) the conductive structures 136 and one or more of the dielectric blocking material 120 and the insulative structures 104. For convenience, the dielectric barrier material 132 is absent in additional views (FIG. 1J) of the drawings, although it is understood that the electronic device 100 may include the dielectric barrier material 132.

With continued reference to FIG. 1F, the tunnel dielectric material 116 may exhibit a thickness $Th_1$ (e.g., in the X-direction) that is relatively greater than or, alternatively, substantially similar to a thickness $Th_3$ of the dielectric blocking material 120. The memory material 118 may exhibit a thickness $Th_2$ that is relatively greater than each of the thickness $Th_1$ of the tunnel dielectric material 116 and the thickness $Th_3$ of the dielectric blocking material 120. For example, the thickness $Th_1$ of the tunnel dielectric material 116 may be substantially the same as the thickness $Th_3$ of the dielectric blocking material 120, each of which is less than the thickness $Th_2$ of the memory material 118. In some embodiments, the thickness $Th_3$ of the dielectric blocking material 120 may be relatively less than each of the thickness $Th_1$ of the tunnel dielectric material 116 and the thickness $Th_2$ of the memory material 118. Further, a thickness $Th_4$ of the charge storage structure 148 represents combined thicknesses of each of the thickness $Th_1$ of the tunnel dielectric material 116, the thickness $Th_2$ of the memory material 118, and the thickness $Th_3$ of the dielectric blocking material 120.

By way of non-limiting example, each of the thickness $Th_1$ of the tunnel dielectric material 116 and the thickness $Th_3$ of dielectric blocking material 120 may individually be within a range of from about 0.5 nm to about 2 nm, such as from about 0.5 nm to about 1 nm, from about 1 nm to about 1.5 nm, or from about 1.5 nm to about 2 nm. The thickness $Th_2$ of the memory material 118 be within a range of from about 2 nm to about 6 nm, such as from about 2 nm to about 3 nm, from about 3 nm to about 4 nm, from about 4 nm to about 5 nm, or from about 5 nm to about 6 nm. Thus, the thickness $Th_4$ of the charge storage structure 148 may be within a range of from about 3 nm to about 10 nm, such as from about 3 nm to about 4 nm, from about 4 nm to about 6 nm, from about 6 nm to about 8 nm, or from about 8 nm to about 10 nm. In some embodiments, the thickness $Th_4$ of the charge storage structure 148 is between about 5 nm and about 7 nm (e.g., about 6 nm).

FIG. 1G shows an enlarged portion of the memory cell 146 in a similar location to that of box F in FIG. 1E. However, FIG. 1G illustrates a different configuration of a memory cell 146 than that depicted in FIG. 1F. With reference to FIG. 1G, the memory cells 146 may each include the channel material 114 horizontally neighboring the insulative material 112 and the tunnel dielectric material 116 horizontally neighboring the channel material 114. In the embodiment of FIG. 1G, however, additional portions of the memory material 118 and the dielectric blocking material 120 may be selectively removed from the upper surfaces and the lower surfaces of the insulative structures 104 within the cell openings 128 (FIG. 1D), such that only vertically oriented portions of the memory material 118 and the dielectric blocking material 120 remain horizontally adjacent to the tunnel dielectric material 116. In other words, discontinuous (e.g., segmented) portions of the memory material 118 and the dielectric blocking material 120 may extend vertically along exposed side surfaces of the tunnel dielectric material 116, without extending horizontally along the upper surfaces and the lower surfaces of the insulative structures 104. In some such embodiments, a portion of the dielectric blocking material 120 may be adjacent to (e.g., directly adjacent to) the insulative structures 104. In embodiments including vertical portions of the memory material 118 and the dielectric blocking material 120, without including horizontal portions thereof, the dielectric barrier material 132 may be formed adjacent to (e.g., directly adjacent to) the insulative structures 104.

In the embodiment of FIG. 1G including only the vertically oriented portions of the memory material 118 and the dielectric blocking material 120 horizontally adjacent to the tunnel dielectric material 116, differing processing techniques may, optionally, be employed. For example, prior to forming the tunnel dielectric material 116 of the pillars 130 within the openings 110 (FIG. 1A), end portions of the additional insulative structures 106 (FIG. 1B) may be laterally recessed relative to corresponding side surfaces of the insulative structures 104. Thereafter, one or more (e.g., each) of the memory material 118 and the dielectric blocking material 120 may be formed within recessed portions vacated by the end portions of the additional insulative structures 106 prior to forming the tunnel dielectric material 116.

FIG. 1H shows an enlarged portion of the memory cell 146 in a similar location to that of box F in FIG. 1E. However, FIG. 1H illustrates a different configuration of a memory cell 146 than that depicted in FIGS. 1F and 1G. With reference to FIG. 1H, the memory cells 146 may each include the channel material 114 horizontally neighboring the insulative material 112 and the tunnel dielectric material 116 horizontally neighboring the channel material 114. However, the memory cells 146 of the embodiment of FIG. 1H may each include the dielectric blocking material 120 horizontally neighboring the tunnel dielectric material 116 and discontinuous (e.g., segmented) portions of the memory material 118 horizontally neighboring the dielectric blocking material 120.

As shown in FIG. 1H, the dielectric blocking material 120 may be horizontally interposed between the tunnel dielectric material 116 and each of the memory material 118 and the insulative structures 104 of tiers 142 of the stack 141. For example, the dielectric blocking material 120 may be formed within the openings 110 (FIG. 1A) prior to forming the tunnel dielectric material 116. Accordingly, the dielectric blocking material 120 may be horizontally adjacent to (e.g., directly adjacent to) the insulative structures 104 and the additional insulative structures 106 (FIG. 1A) of the tiers 102 (FIG. 1A) of a preliminary stack (e.g., the stack 101 (FIG. 1A)) prior to formation of the memory material 118 within the cell openings 128 (FIG. 1D). In other words, the dielectric blocking material 120 may be formed (e.g., conformally formed) directly on exposed side surfaces of the insulative structures 104 and the additional insulative structures 106 within the openings 110, without additional materials being formed therebetween. Thus, the dielectric blocking material 120 of the embodiment of FIG. 1H may be substantially continuous along a height of the pillars 130 (FIG. 1E).

In some embodiments, only vertical (e.g., vertically oriented) portions of the memory material 118 remain horizontally adjacent to the dielectric blocking material 120, as shown in FIG. 1H. In other embodiments, additional portions of the memory material 118 may extend horizontally along the upper surfaces and the lower surfaces of the insulative structures 104, similar to that illustrated in FIG. 1F, as a result of conformally forming the memory material 118 within the cell openings 128 (FIG. 1D). In embodiments including only the vertically oriented portions of the memory material 118 horizontally adjacent to the dielectric blocking material 120, the memory material 118 may, optionally, be formed within recessed portions vacated by end portions of the additional insulative structures 106 (FIG. 1B) prior to forming the dielectric blocking material 120 of the pillars 130 within the openings 110 (FIG. 1A).

As in the previous embodiment, the tunnel dielectric material 116, the memory material 118, and the dielectric blocking material 120 together may comprise the charge storage structure 148 interposed between the channel material 114 and the conductive structures 136. The dielectric barrier material 132 may, optionally, be formed adjacent to (e.g., directly adjacent to) the memory material 118 and the conductive liner material 134 may, optionally, be formed adjacent to (e.g., directly adjacent to) the dielectric barrier material 132, if present, as illustrated in FIG. 1H. Forming the dielectric blocking material 120 within the openings 110 (FIG. 1A) of the pillars 130 may provide a greater cross-sectional area for formation of the conductive structures 136 within the cell openings 128 (FIG. 1D), which in turn may provide a reduced resistivity (e.g., electrical resistance levels) of the conductive materials thereof without significantly affecting conductivity.

FIG. 1I illustrates an enlarged portion of the memory material 118 of FIG. 1E. As shown in FIG. 1I, the memory material 118 may be formed of and include a charge storage material 152. For illustrative purposes, opposing portions of the charge storage material 152 may be separated from one another by an additional portion (e.g., a central portion) of the charge storage material 152 including individual particles of an embedded material 154 dispersed therein. Accordingly, the embedded material 154 may be formed within the central portion of the charge storage material 152 that is horizontally interposed between two opposing portions of the charge storage material 152. In other words, the embedded material 154 is centrally located within the memory material 118 and the opposing portions of the charge storage material 152 are substantially devoid (e.g., substantially absent) of the embedded material 154. The embedded material 154 may be isolated from the tunnel dielectric material 116 by the charge storage material 152 without being in contact therewith.

The charge storage material 152 may be formed of and include at least one insulative material (e.g., a high-k dielectric material). In some embodiments, the charge storage material 152 comprises $HfZrO_x$. In other embodiments, the charge storage material 152 comprises one or more of $AlO_x$, $HfO_x$, $HfSiO_2$, $NbO_x$, $TiO_x$, $ZrO_x$, $TaO_x$, and $MgO_x$. In embodiments including $HfZrO_x$, the charge storage material 152 may include more hafnium atoms than zirconium atoms. For example, electrical properties may be tailored by selecting a ratio of hafnium atoms to zirconium atoms in the charge storage material 152. By way of nonlimiting example, the charge storage material 152 may include at least about 3 hafnium atoms for every zirconium atom, at least about 4 hafnium atoms for every zirconium atom, or at least about 5 hafnium atoms for every zirconium atom. For example, a ratio of zirconium atoms may be between about 0.1 and about 0.5, such as between about 0.1 and about 0.3, or between about 0.3 and about 0.5, and a ratio of hafnium atoms may be between about 0.4 and about 1, such as between about 0.4 and about 0.6, between about 0.8 and about 0.8, or between about 0.8 and about 1. In other embodiments, the charge storage material 152 may include more zirconium atoms than hafnium atoms, such that the charge storage material 152 includes at least about 3 zirconium atoms for every hafnium atom, at least about 4 zirconium atoms for every hafnium atom, or at least about 5 zirconium atoms for every hafnium atom. Further, a ratio of oxygen atoms may, for example, be between about 1 and about 3, such as between about 1 and about 2, or between about 2 and about 3.

The charge storage material 152 may, optionally, include one or more additional elements, such as bismuth, antimony, arsenic, tantalum, strontium, niobium, titanium, aluminum, and lanthanum, or a combination thereof. The charge storage material 152 may also include at least one dopant (e.g., bismuth, aluminum), which may be selected to tailor the dielectric constant of the charge storage material 152. In some embodiments, a material composition of the opposing portions and the central portion of the charge storage material 152 may be substantially the same as one another. In other embodiments, a material composition of one or more of the opposing portions and the central portion of the charge storage material 152 may differ from one another, so long as a work function of the respective materials is substantially similar.

The embedded material 154 may be formed of and include a relatively high work function (e.g., greater than about 4.5 eV) conductive material such as, for example, Ni, Pt, Au, Co, Ru, W, Mo, Ta, TaN, or combinations thereof. In some embodiments, the embedded material 154 may comprise conductive nanoparticles (e.g., ruthenium nanoparticles, crystalline nanoparticles, metal dots). In some embodiments, individual particles of the embedded material 154 of the memory material 118 may be spaced apart from one another. In other words, individual particles of the embedded material 154 within the charge storage material 152 may include discrete (e.g., discontinuous) portions. As used herein, the term "discrete" means and includes a material or structure that is defined by one or more differing materials or structures. For example, the charge storage material 152 may segment the individual particles of the embedded material 154 from one another. At least some of the particles of the embedded material 154 may, alternatively, or additionally, be in direct contact with one another, as shown in FIG. 1I. In some such embodiments, the embedded material 154 may form a substantially continuous material (e.g., a monolayer, a bi-layer, a multi-layer) within a portion (e.g., the central portion) of the charge storage material 152, so long as there are no discontinuities (e.g., gaps) within the memory material 118. In other words, one or more portions of the embedded material 154 may be interposed (e.g., sandwiched) between the opposing portions of the charge storage material 152.

By way of non-limiting example, each of the opposing portions of charge storage material 152 of the memory material 118 (e.g., portions lacking the embedded material 154) may exhibit a thickness that is substantially similar to one another, each of which may individually be within a range of from about 0.5 nm to about 2 nm, such as from about 0.5 nm to about 1 nm, from about 1 nm to about 1.5 nm, or from about 1.5 nm to about 2 nm. The central portion of the charge storage material 152 including the embedded material 154 may exhibit a thickness that is relatively greater than or, alternatively, substantially similar to the thickness of each of the opposing portions of the charge storage material 152. For example, the thickness of the central portion of the charge storage material 152 including the embedded material 154 may be within a range of from about 1 nm to about 3 nm, such as from about 1 nm to about 1.5 nm, from about 1.5 nm to about 2 nm, from about 2 nm to about 2.5 nm, or from about 2.5 nm to about 3 nm. In some embodiments, the thickness $Th_2$ (FIG. 1F) of the memory material 118, including the charge storage material 152 and the embedded material 154, is about 3.5 nm. In other words, the thickness of each of the opposing portions of the charge storage material 152 and the thickness of the central portion thereof including the embedded material 154 is encompassed within the thickness $Th_2$ of the memory material 118.

FIG. 1J illustrates a simplified partial top-down view of the electronic device 100 of FIG. 1E taken along the J-J line at a horizontal centerline of one of the conductive structures 136 of the conductive levels 138 (FIG. 1E). The dielectric barrier material 132 has been omitted in the top-down view of FIG. 1J for clarity. The pillars 130 may include a substantially round (e.g., substantially circular) horizontal cross-sectional area. Alternatively, the horizontal cross-sectional shape of the pillars 130 may have another shape (e.g., a substantially square cross-sectional shape). As best shown in the top-down view of FIG. 1J, the conductive liner material 134, if present, is horizontally adjacent to the conductive structures 136, the dielectric blocking material 120 is horizontally adjacent to the conductive liner material 134, the memory material 118 is horizontally adjacent to the dielectric blocking material 120, and the tunnel dielectric material 116 is horizontally adjacent to the memory material 118. In addition, the channel material 114 is horizontally adjacent to the tunnel dielectric material 116 and the insulative material 112 is horizontally adjacent to and substantially surrounded by the channel material 114. One or more of the air gaps 150 (e.g., voids, unfilled volumes) may, optionally, be partially defined by portions of the insulative material 112.

With reference to FIG. 1E in combination with FIG. 1J, the memory material 118 may be in direct physical contact with and substantially surround (e.g., substantially continuously surround) the tunnel dielectric material 116 of the individual pillars 130 at the conductive levels 138 including the conductive structures 136, without surrounding the tunnel dielectric material 116 at individual levels of the insulative structures 104, as shown in FIG. 1E. The dielectric blocking material 120 may be in direct physical contact with and substantially surround (e.g., substantially continuously surround) the memory material 118 at the conductive levels 138 including the conductive structures 136, without being formed at individual levels of the insulative structures 104. Accordingly, one or more (e.g., both) of the memory material 118 and the dielectric blocking material 120 may substantially surround the pillars 130 in at least one horizontal direction (e.g., the X-direction, the Y-direction). In additional embodiments, such as in the embodiment of FIG. 1H in which the pillars 130 include the dielectric blocking material 120, the memory material 118 may be in direct physical contact with and substantially surround (e.g., substantially continuously surround) the dielectric blocking material 120 of the individual pillars 130 at individual levels of the conductive levels 138.

FIG. 1K illustrates a simplified partial top-down view of the electronic device 100 of FIG. 1E taken along the K-K line at a horizontal centerline of one of the insulative structures 104 of the stack 141 (FIG. 1E). As best shown in the top-down view of FIG. 1K, the tunnel dielectric material 116 is horizontally adjacent to the insulative structures 104, the channel material 114 is horizontally adjacent to the tunnel dielectric material 116, and the insulative material 112 is horizontally adjacent to the channel material 114. One or more of the air gaps 150 may, optionally, be partially defined by portions of the insulative material 112. However, and in contrast to the top-down view in FIG. 1J, no memory material 118 or dielectric blocking material 120 is horizontally adjacent to the insulative structures 104.

With reference to FIG. 1E in combination with FIG. 1K, the tunnel dielectric material 116 may be in direct physical contact with and substantially surround (e.g., substantially continuously surround) the channel material 114 at levels of the insulative structures 104, as shown in FIG. 1E. The insulative structures 104 may be in direct physical contact with and substantially surround (e.g., substantially continuously surround) the tunnel dielectric material 116 at levels of the insulative structures 104, without additional materials (e.g., the memory material 118, the dielectric blocking material 120) being formed therebetween.

As described above, forming the stack 141 of the electronic device 100 to include the memory material 118 and the dielectric blocking material 120 within the conductive levels 138 using two or more (e.g., two) separate process acts may facilitate improved performance of the electronic device 100. For example, formation of one or more of the memory material 118 and the dielectric blocking material 120 within the conductive levels 138 of the tiers 142 of the stack 141 effectively reduces a horizontal dimension (e.g., diameter) of the pillars 130, compared to conventional pillars including such materials (e.g., memory material, dielectric blocking material) adjacent to a tunnel dielectric material formed within pillar openings. Accordingly, the charge storage structure 148 including the memory material 118 may be formed without necessitating an increase in the horizontal footprint of the tiers 142 or the blocks (e.g., the first block 124, the second block 126) to provide a relatively high density of memory array within the electronic device 100 compared to that of conventional electronic devices.

In use and operation, the electronic device 100 including the memory cells 146 comprising embodiments of the memory material 118 including the embedded material 154 within the charge storage material 152 described herein may consume less power than conventional electronic devices including memory cells comprising conventional insulative materials. For example, during use and operation, the electronic device 100 including the memory cells 146 comprising the materials of the memory material 118 may facilitate relatively low bias voltages (e.g., having a magnitude below about 5V, below about 6V, below about 7V, or below about 8V) of the memory cells 146. Providing the embedded material 154 within the charge storage material 152 of the memory material 118 may facilitate an increased memory window (e.g., a voltage difference between threshold states of a program state and an erase state) and a larger capacitance versus voltage (C-V) hysteresis. The memory material 118 exhibiting a relatively large memory window (e.g., up to about 9V), as well as the reduced bias voltage (e.g., about 5V), may be desirable for electronic devices (e.g., non-volatile memory devices) utilizing a reduced power consumption within a higher density of memory array.

The presence of the embedded material 154 within the charge storage material 152 of the memory material 118 may also provide increased charge retention during various memory operations (e.g., read, program, erase, etc.). Without being bound to any theory, it is believed that both electrons and holes may be trapped proximal to the embedded material 154 of the memory material 118 and that the hole-trapping mechanism thereof contributes to the increased charge retention of the memory material 118. Further, the embedded material 154 may exhibit a relatively high work function and a relatively high density of states around the Fermi level (e.g., thermodynamic work required to add one electron to a body of material). The relatively high work function of the embedded material 154 may enable a reduced thickness of one or more of the thickness $Th_1$ (FIG. 1F) of the tunnel dielectric material 116 and the thickness $Th_3$ (FIG. 1F) of the dielectric blocking material 120, which enables the electronic device 100 to operate at the reduced bias voltage. Further, the materials of the memory material 118 may facilitate a multi-level cell (MLC) memory device (e.g., storing two or more bits per cell).

Electronic devices formed according to embodiments described herein may exhibit improved performance, reliability, and durability by forming one or more of the memory material 118 and the dielectric blocking material 120 during formation of the conductive structures 136 of the conductive levels 138 within conductive tiers of the tiers 142. Additional performance improvements may be achieved by the memory material 118 of the charge storage structure 148 comprising the embedded material 154 within the charge storage material 152, which configuration may exhibit improved performance, reliability, and durability compared to conventional electronic devices.

Thus, in accordance with some embodiments of the disclosure, a method of forming an electronic device comprises forming a stack comprising vertically alternating insulative structures and additional insulative structures, and forming pillars comprising a channel material and a tunnel dielectric material extending through the stack. The tunnel dielectric material directly contacts the vertically alternating insulative structures and additional insulative structures. The method comprises removing the additional insulative structures to form cell openings, forming a charge storage material within a portion of the cell openings, and forming a conductive material within central portions of the cell openings.

Moreover, in accordance with further embodiments of the disclosure, an electronic device comprises a stack comprising tiers of alternating conductive structures and insulative structures, and pillars vertically extending through the stack. The pillars comprise a tunnel dielectric material, a channel material, and an insulative material substantially surrounded by the channel material. The electronic device comprises a memory material horizontally adjacent to the conductive structures without being horizontally adjacent to the insulative structures.

One of ordinary skill in the art will appreciate that, in accordance with additional embodiments of the disclosure, the features and feature configurations described above in relation to FIGS. 1A through 1K may be adapted to design needs of different electronic devices (e.g., different memory devices). By way of non-limiting example, in accordance with additional embodiments of the disclosure, FIGS. 2A through 2J show simplified partial cross-sectional views (FIGS. 2A through 2H) and simplified partial top-down views (FIGS. 21 and 2J) of a method of forming an electronic device having a different configuration than the electronic device 100. FIGS. 2F through 2H are enlarged portions of FIG. 2E. FIGS. 21 and 2J are simplified partial top-down views taken along the I-I line and the J-J line, respectively, in FIG. 2E. Throughout the remaining description and the accompanying figures, functionally similar features (e.g., structures, devices) are referred to with similar reference numerals. To avoid repetition, not all features shown in the remaining figures (including FIGS. 2A through 2J) are described in detail herein. Rather, unless described otherwise below, a feature designated by a reference numeral of a previously-described feature (whether the previously-described feature is first described before the present paragraph, or is first described after the present paragraph) will be understood to be substantially similar to the previously-described feature.

Figure 2A:
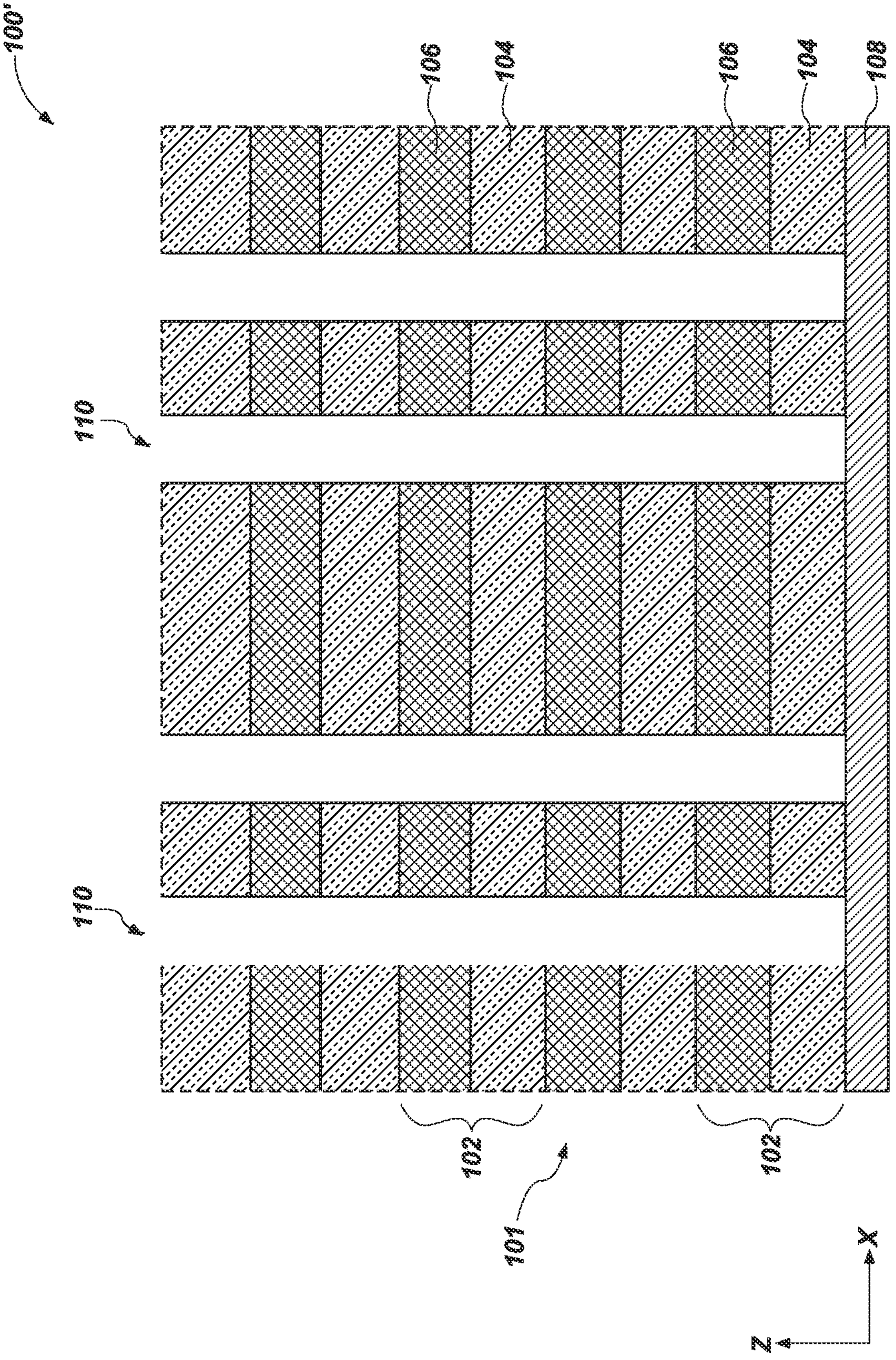
FIGS. 2A through 2J are simplified partial cross-sectional views (FIGS. 2A through 2H) and simplified partial top-down views (FIGS. 21 and 2J) illustrating a method of forming an electronic device, in accordance with additional embodiments of the disclosure, where the top-down views of FIGS. 21 and 2J are taken along the I-I line and the J-J line, respectively, in FIG. 2E.

FIG. 2A illustrates a simplified partial cross-sectional view of an electronic device 100'. At the processing stage depicted in FIG. 2A, the electronic device 100' may be substantially similar to the electronic device 100 at the processing stage depicted in FIG. 1A. The electronic device 100' may include the stack 101 including the vertically alternating sequence of the insulative structures 104 and the additional insulative structures 106 arranged in the tiers 102. The stack 101 may be formed on or over the source 108, and the openings 110 may be formed through the stack 101 to expose a portion of the source 108.

Figure 2B:
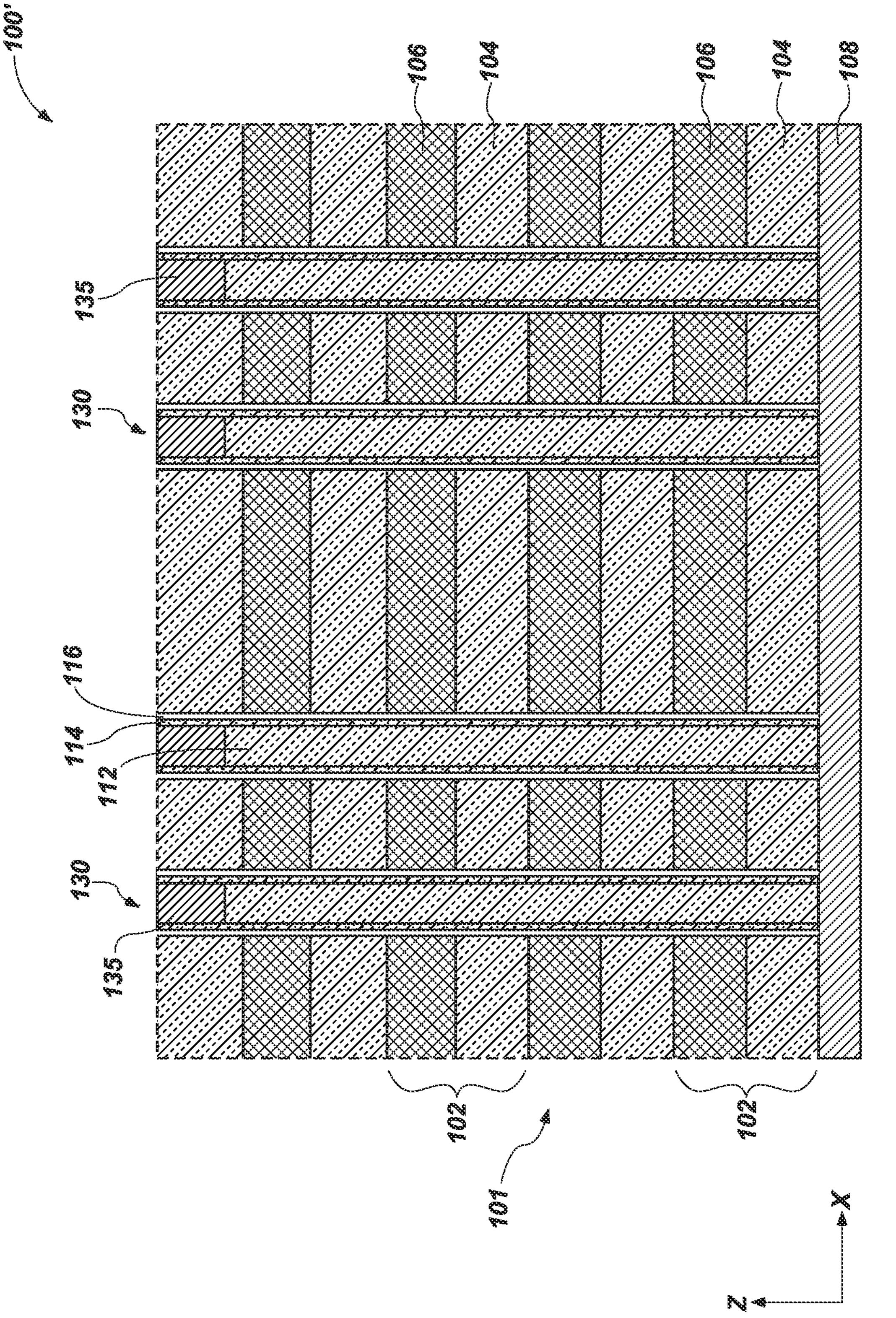

Referring to FIG. 2B, the pillars 130 of materials may be formed to vertically extend through the stack 101. The pillars 130 may each comprise the insulative material 112, the channel material 114 horizontally adjacent to the insulative material 112, and the tunnel dielectric material 116 horizontally adjacent to the channel material 114. The conductive contact structures 135 may be formed in electrical communication with the channel material 114 of the pillars 130. The materials of the pillars 130 may include substantially the same materials and properties as the materials of the pillars 130 described above with reference to FIG. 1B.

As described above in relation to FIGS. 1A through 1K, the tunnel dielectric material 116 may be formed directly on exposed side surfaces of the insulative structures 104 and the additional insulative structures 106 within the openings 110 (FIG. 2A), without additional materials being formed therebetween. Accordingly, the tunnel dielectric material 116 is horizontally adjacent to (e.g., directly adjacent to) the insulative structures 104 and the additional insulative structures 106 of the tiers 102 of the stack 101. Additional materials (e.g., a charge storage material) may subsequently be formed horizontally adjacent to portions of the tunnel dielectric material 116 (e.g., external to the openings 110) for formation of the memory cells 146 of the electronic device 100' (e.g., a memory device). The electronic device 100' may be configured as a single-level cell (SLC) memory device or, alternatively, to include multi-level cells (MLC), triple-level cells (TLC), quad-level cells (QLC), etc., or combinations thereof.

Figure 2C:
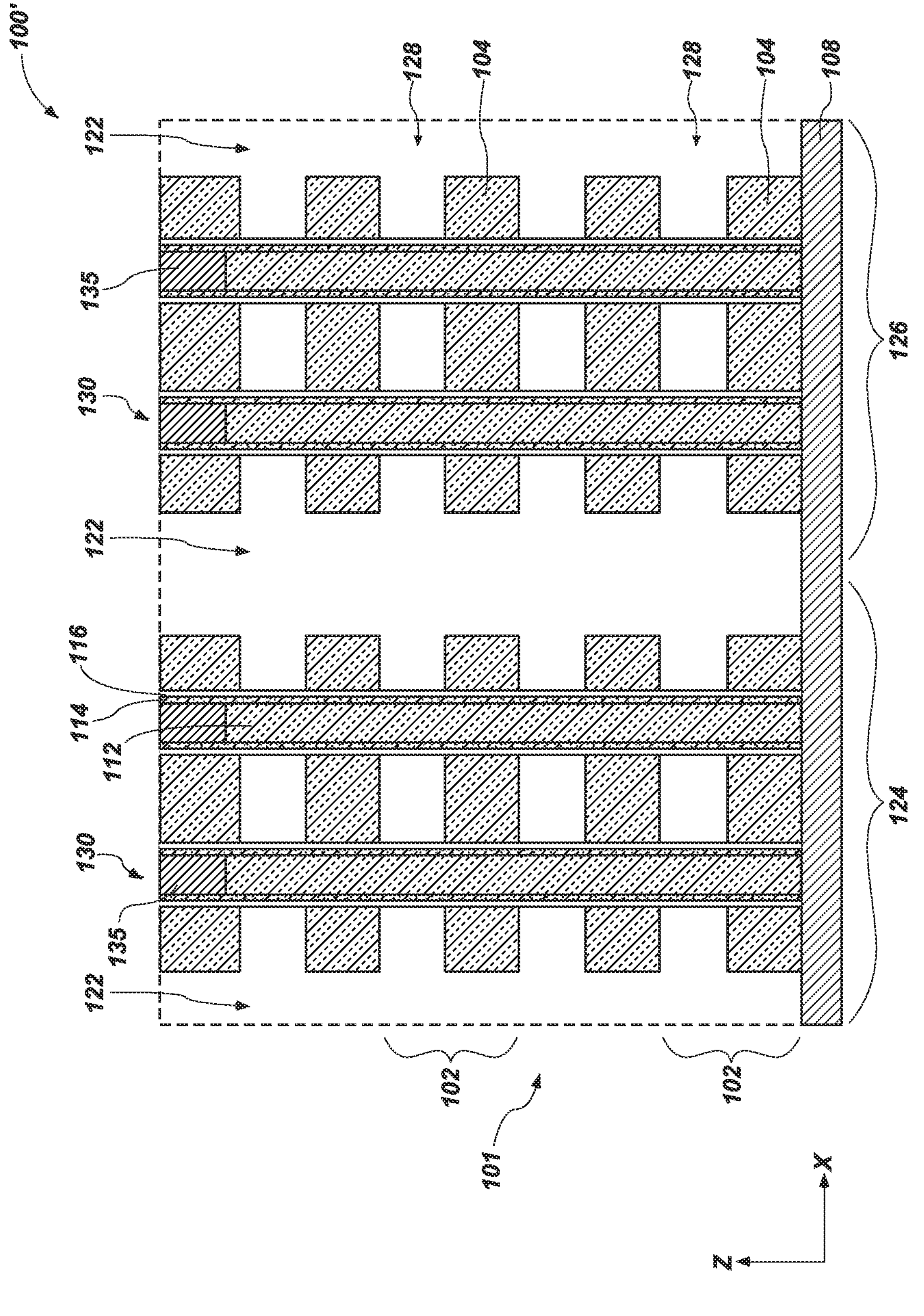

Referring to FIG. 2C, the slots 122 may be formed to vertically extend completely through the stack 101 and expose surfaces of the source 108. The slots 122 may divide the electronic device 100 into separate blocks, such as a first block 124 and a second block 126. After forming the slots 122, the additional insulative structures 106 (FIG. 2B) of the stack 101 may be at least partially (e.g., substantially) removed through the slots 122 through a so-called "replacement gate" or "gate last" process to form the cell openings 128.

Figure 2D:
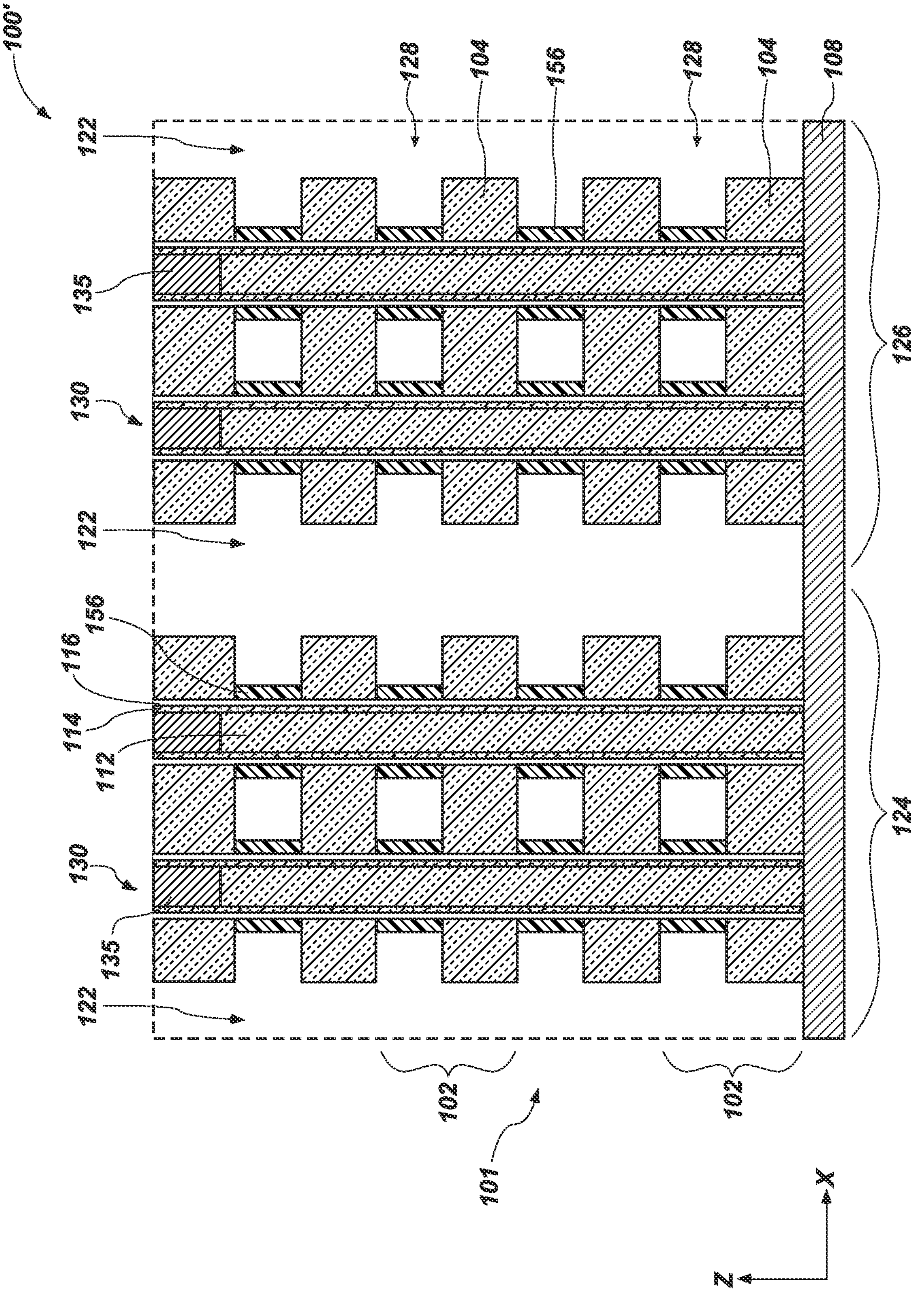

Referring to FIG. 2D, following formation of the cell openings 128, a charge storage material 156 (e.g., a charge transfer material) may be formed (e.g., conformally formed) between vertically neighboring insulative structures 104 at locations corresponding to the previous locations of the additional insulative structures 106 (FIG. 2B). The charge storage material 156 may include a number (e.g., multiple, more than one, a series) of multi-stacked materials of a multi-stacked structure (e.g., a gate stack), as described in greater detail with reference to FIG. 2G.

The charge storage material 156 may be formed adjacent to (e.g., vertically adjacent to) the insulative structures 104 and adjacent to (e.g., horizontally adjacent to) the tunnel dielectric material 116 within the cell openings 128 and within portions of the slots 122. Individual materials of the charge storage material 156 may be formed using one or more conformal deposition processes, such as one or more of conventional conformal CVD processes or conventional ALD processes. Since the materials of the charge storage material 156 are conformally formed, a portion (e.g., a central portion) of the cell openings 128 within the stack 101 may remain substantially free of the charge storage material 156. Accordingly, the charge storage material 156 is formed in the cell openings 128 without fully filling the cell openings 128 of the stack 101. The charge storage material 156 may be formed adjacent to (e.g., directly adjacent to) exposed surfaces (e.g., upper surfaces, lower surfaces) of the insulative structures 104 and adjacent to (e.g., directly adjacent to) exposed surfaces (e.g., side surfaces) of the tunnel dielectric material 116 of the pillars 130.

In some embodiments, a dielectric blocking material (e.g., corresponding to the dielectric blocking material 120) of the embodiment of FIGS. 1A through 1K may be formed adjacent to the charge storage material 156 within the cell openings 128 of the stack 141 of the electronic device 100'. In other embodiments, the charge storage material 156 may be formed without forming an adjacent dielectric blocking material as a result of the charge storage material 156 including the multi-stacked structure including the series of multi-stacked materials (e.g., dielectric materials). In other words, the electronic device 100' differs from the previous embodiment in that the charge storage material 156 may replace (e.g., be formed in lieu of) the memory material 118 (e.g., a charge trapping material) and the dielectric blocking material 120 of the previous embodiment.

Portions of the charge storage material 156 within the slots 122 may be selectively removed, such as by etching, to remove the charge storage material 156 from side surfaces of the insulative structures 104 defining the slots 122. In some embodiments, remaining portions of the charge storage material 156 extend horizontally along the upper surfaces and the lower surfaces (not shown) of the insulative structures 104 as a result of conformally forming the materials of the charge storage material 156 within the cell openings 128.

In other embodiments, additional portions of the charge storage material 156 may be selectively removed from the upper surfaces and the lower surfaces of the insulative structures 104 within the cell openings 128, such that only vertically oriented portions of the charge storage material 156 remain horizontally adjacent to the tunnel dielectric material 116. In other words, discontinuous (e.g., segmented) portions of the charge storage material 156 may extend vertically along exposed side surfaces of the tunnel dielectric material 116, without extending horizontally along the upper surfaces and the lower surfaces of the insulative structures 104, as shown in FIG. 2D. In some such embodiments, differing processing techniques may, optionally, be employed. For example, prior to forming the tunnel dielectric material 116 of the pillars 130 within the openings 110 (FIG. 2A), end portions of the additional insulative structures 106 (FIG. 2B) may be laterally recessed relative to corresponding side surfaces of the insulative structures 104. Thereafter, the materials of the charge storage material 156 may be formed within recessed portions vacated by the end portions of the additional insulative structures 106 prior to forming the tunnel dielectric material 116.

The charge storage material 156 may comprise one or more materials formulated and configured to store charge received from the channel material 114 during operation of the electronic device 100'. However, the configuration and operation of the charge storage material 156 differs from that of the memory material 118 of the electronic device 100 of FIGS. 1A through 1K. For example, the materials of the charge storage material 156 and the resulting operation thereof differ from that of a charge trapping material. Rather, the charge storage material 156 of the embodiment of FIGS. 2A through 2J may be characterized as an interfacial dipole material that uses interfacial dipole modulation (IDM) in individual portions of a switching material (e.g., a silicon oxide material) interposed between additional materials (e.g., additional oxide materials), as described in greater detail with reference to FIGS. 2G and 2H.

Figure 2E:
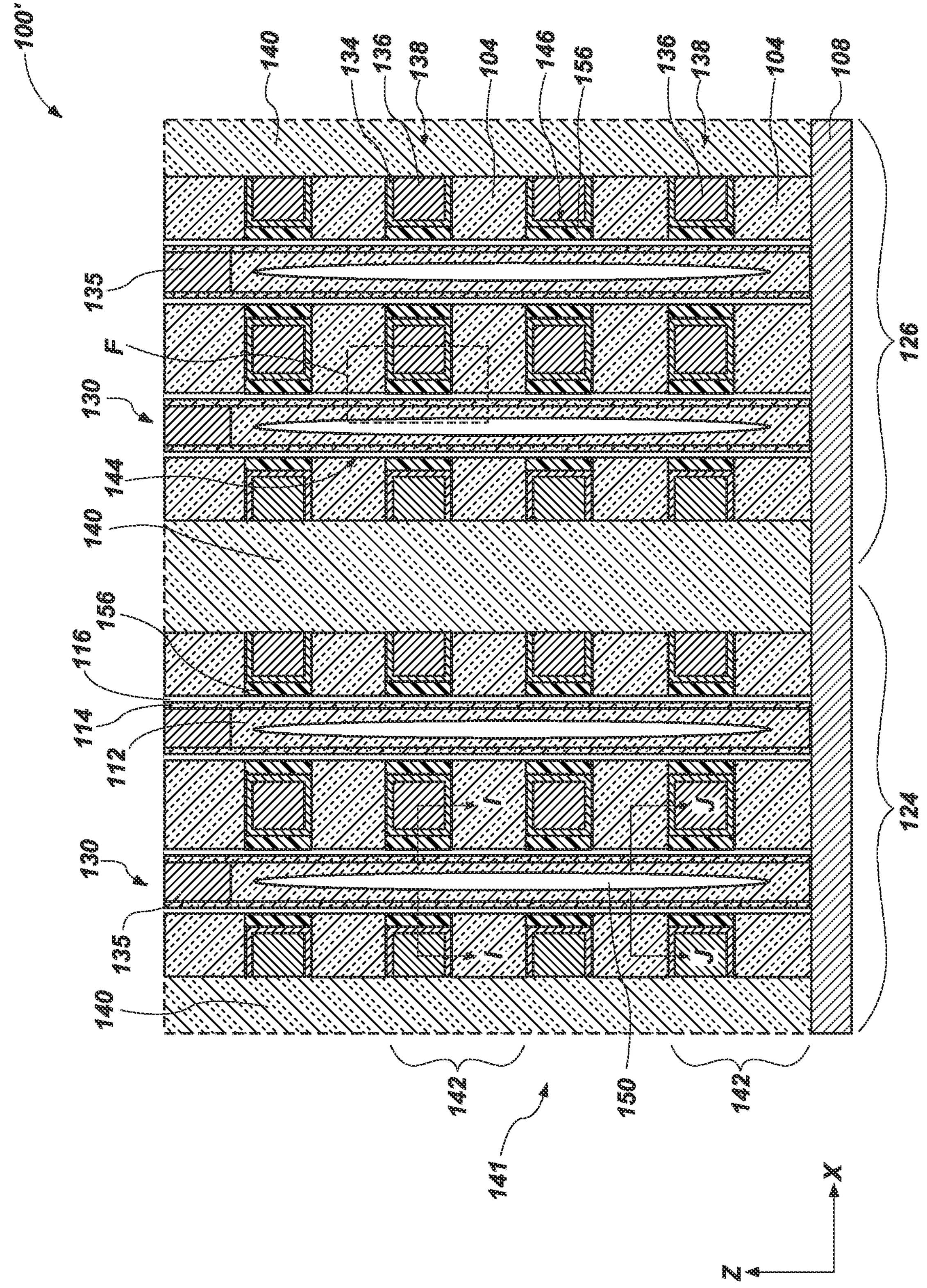
Figure 2F:
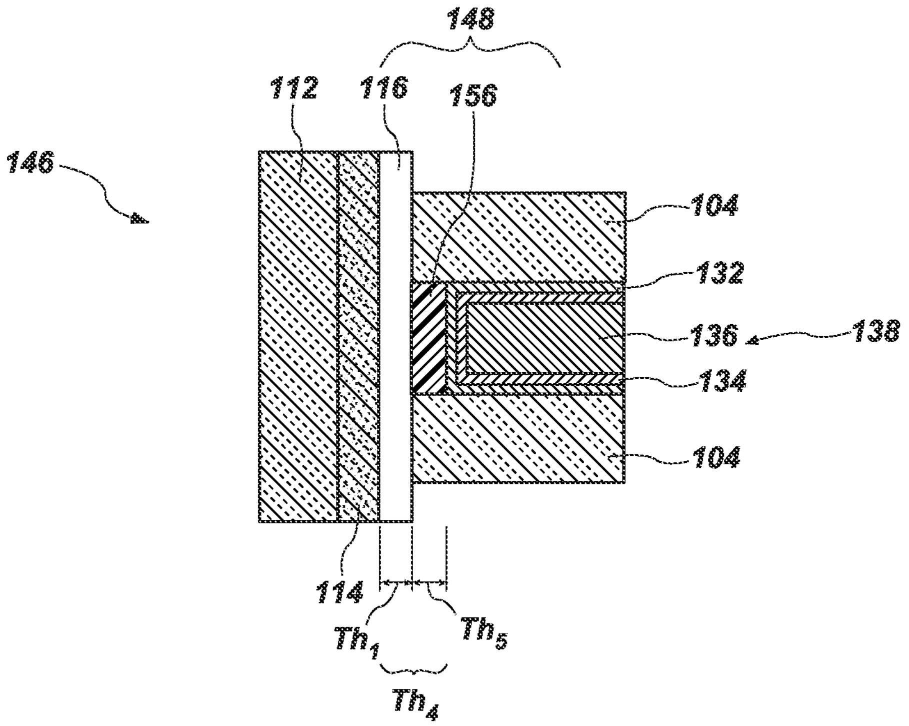
Figure 2G:
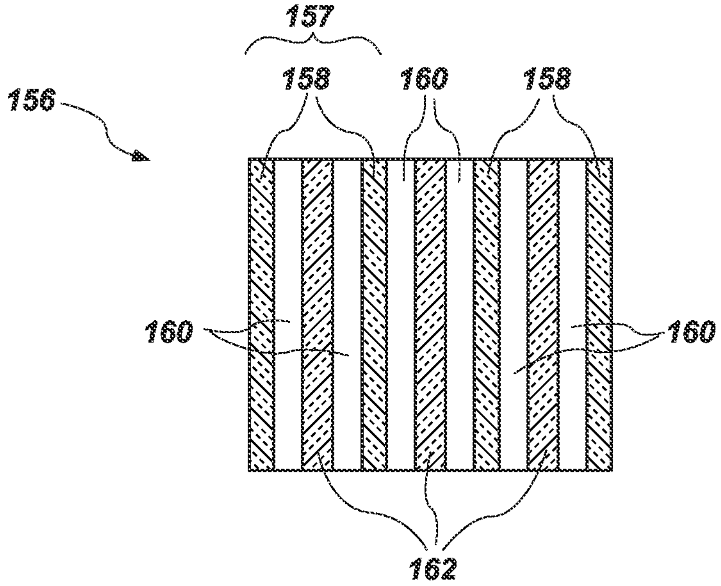
Figure 2H:
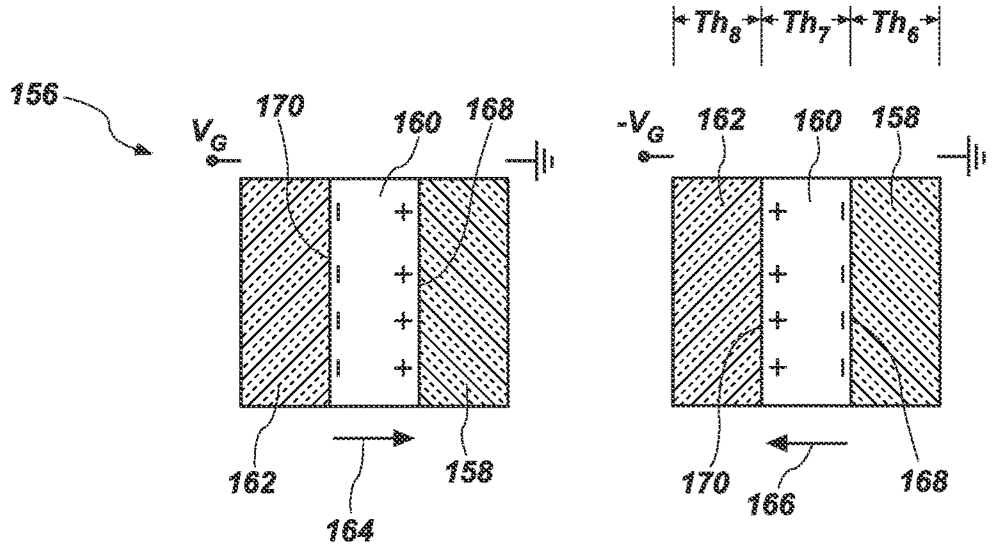

Referring to FIG. 2E, following formation of the charge storage material 156, the conductive liner material 134 may, optionally, be formed in the cell openings 128 (FIG. 2D). For example, the conductive liner material 134 may be formed adjacent to (e.g., directly adjacent to) one or more of the insulative structures 104 and the charge storage material 156. In other embodiments, the dielectric barrier material 132 (FIG. 2F) may, optionally, be formed adjacent to the conductive liner material 134 within the cell openings 128.

The conductive structures 136 may be formed between vertically neighboring insulative structures 104 at locations corresponding to the previous locations of the additional insulative structures 106 (FIG. 2B). For example, the conductive structures 136 may be formed adjacent to (e.g., vertically adjacent to, horizontally adjacent to) the charge storage material 156 within the cell openings 128. The conductive structures 136 may substantially completely fill the cell openings 128 so as to substantially fully extend between exposed upper and lower surfaces of the charge storage material 156 or, alternatively, between exposed upper and lower surfaces of the conductive liner material 134, if present.

Accordingly, the charge storage material 156 may be horizontally interposed between the tunnel dielectric material 116 of the pillars 130 and the conductive structures 136. In some embodiments, the charge storage material 156 may be vertically interposed between the insulative structures 104 and the conductive structures 136. One or more additional materials (e.g., the dielectric barrier material 132 (FIG. 2F), the conductive liner material 134) may be interposed (e.g., horizontally interposed, vertically interposed) between the charge storage material 156 and the conductive structures 136. Alternatively, the conductive structures 136 may be formed adjacent to (e.g., directly adjacent to) exposed surfaces of the insulative structures 104. Portions of the conductive material of the conductive structures 136 within the slots 122 (FIG. 2D) may be selectively removed, such as by etching, to isolate the conductive structures 136 from one another.

Formation of the conductive structures 136 of the electronic device 100' may form the conductive levels 138 vertically interposed between vertically neighboring insulative structures 104. The conductive levels 138 comprise the conductive structures 136, the memory material 118, the dielectric blocking material 120, and one or more (e.g., each) of the dielectric barrier material 132 (FIG. 2F) and the conductive liner material 134. In some embodiments, the conductive levels 138 are located within vertical boundaries defined by vertically neighboring insulative structures 104. Formation of the conductive structures 136 results in formation of the tiers 142 of the insulative structures 104 and the conductive structures 136 of the conductive levels 138, and the strings 144 of the memory cells 146 vertically extending through the stack 141.

As in the previous embodiment, the slots 122 (FIG. 2D) may be substantially filled with the insulative material 140. One or more of the air gaps 150 may, optionally, be present in the insulative material 112 of the pillars 130. For simplicity and ease of understanding the disclosure, the air gaps 150 are illustrated at the process stage depicted in FIG. 2E. However, the air gaps 150 may be formed at the process stage depicted in FIG. 2B (e.g., during formation of the pillars 130 and prior to formation of the conductive contact structures 135). If no air gaps 150 are present, the insulative material 112 may substantially fill the openings 110 (FIG. 2A) in which the pillars 130 are formed.

Intersections of the conductive structures 136, the charge storage material 156, and the pillars 130 may form individual memory cells 146 of the strings 144 of the memory cells 146. FIG. 2F illustrates an enlarged portion of box F of FIG. 2E and illustrates a memory cell 146, in accordance with embodiments of the disclosure. With reference to FIG. 2F, the memory cells 146 may each include the channel material 114 horizontally neighboring the insulative material 112, the tunnel dielectric material 116 horizontally neighboring the channel material 114, the charge storage material 156 horizontally neighboring the tunnel dielectric material 116, and the conductive structures 136 horizontally neighboring the charge storage material 156.

The tunnel dielectric material 116 and the charge storage material 156 together may comprise the charge storage structure 148 configured to store a charge. In the embodiment of FIGS. 2A through 2J, the charge storage material 156 of the charge storage structure 148 comprises an interfacial dipole material in individual portions of a switching material. In some such embodiments, the tunnel dielectric material 116 comprises Sift and the charge storage material 156 comprises a series of materials of a multi-stacked structure, as described in greater detail with reference to FIG. 2G.

The dielectric barrier material 132 may, optionally, be formed adjacent to (e.g., directly adjacent to) the charge storage material 156 within the cell openings 128 (FIG. 2D). In embodiments including vertical portions of the charge storage material 156, without including horizontal portions thereof, the dielectric barrier material 132 may be formed adjacent to (e.g., directly adjacent to) the insulative structures 104, as illustrated in FIG. 2F.

With continued reference to FIG. 2F, the tunnel dielectric material 116 may exhibit the thickness $Th_1$ (e.g., in the X-direction) and the charge storage material 156 may exhibit a thickness $Th_5$ that is relatively greater than the thickness $Th_1$ of the tunnel dielectric material 116. Further, the thickness $Th_4$ of the charge storage structure 148 represents combined thicknesses of each of the thickness $Th_1$ of the tunnel dielectric material 116 and the thickness $Th_5$ of the charge storage material 156.

By way of non-limiting example, the thickness $Th_1$ of the tunnel dielectric material 116 may be within a range of from about 0.5 nm to about 2 nm, such as from about 0.5 nm to about 1 nm, from about 1 nm to about 1.5 nm, or from about 1.5 nm to about 2 nm. The thickness $Th_5$ of the charge storage material 156 be within a range of from about 4 nm to about 12 nm, such as from about 4 nm to about 6 nm, from about 6 nm to about 8 nm, from about 8 nm to about 10 nm, or from about 10 nm to about 12 nm. In some embodiments, the thickness $Th_5$ of the charge storage material 156 is between about 10 nm and about 12 nm (e.g., about 10.8 nm). In other embodiments, the thickness $Th_5$ of the charge storage material 156 is between about 5 nm and about 7 nm (e.g., about 6 nm). Thus, the thickness $Th_4$ of the charge storage structure 148 may be within a range of from about 4 nm to about 14 nm, such as from about 4 nm to about 6 nm, from about 6 nm to about 8 nm, from about 8 nm to about 10 nm, from about 10 nm to about 12 nm, or from about 12 nm to about 14 nm.

FIG. 2G illustrates an enlarged portion of the charge storage material 156 of FIG. 2E. As shown in FIG. 2G, the charge storage material 156 may be formed of and include one or more regions 157 (e.g., consecutive regions) including a first material 158 (e.g., a high-k dielectric material), a second material 160 (e.g., a switching material), and a third material 162 (e.g., a dipole modulation material). In some embodiments, the first material 158 of the charge storage material 156 is horizontally adjacent to (e.g., directly adjacent to) the tunnel dielectric material 116 (FIG. 2E) of the pillars 130 (FIG. 2E). As illustrated in FIG. 2G, a portion (e.g., a film) of the first material 158 may be horizontally interposed between two opposing portions of the second material 160, and a portion of the third material 162 may be horizontally interposed between two opposing portions of the second material 160. In other words, the first material 158 and the third material 162 are separated from one another by portions of the second material 160 without being in contact with one another. However, the disclosure is not so limited, and the materials of the charge storage material 156 may be arranged in a manner that differs from that described. For example, a single portion of the second material 160 may be horizontally interposed between two opposing portions of the third material 162, and two opposing portions of the first material 158 may be horizontally adjacent to the respective opposing portions of the third material 162 on sides thereof opposite the second material 160. Accordingly, other configurations of the materials of the charge storage material 156 may be contemplated, so long as the second material 160 serves as a switching material between adjacent materials that differ in material composition (e.g., materials that are formulated and configured to exhibit a relatively greater number of oxygen atoms per unit area) than that of the second material 160.

The individual regions 157 of the charge storage material 156 may be defined by a portion of the first material 158, a portion of the second material 160 horizontally adjacent to the first material 158, a portion of the third material 162 horizontally adjacent to the second material 160, another portion of the second material 160 horizontally adjacent to the third material 162, and another portion of the first material 158 horizontally adjacent to the other second material 160. Neighboring regions 157 of the charge storage material 156 may have at least one portion of material (e.g., the first material 158) in common. Accordingly, the charge storage material 156 illustrated in FIG. 2G includes a series of multi-stacked materials including one or more (e.g., three) of the regions 157 that are adjacent to (e.g., horizontally adjacent to) one another. While three of the regions 157 (e.g., a tri-layer structure) are shown in FIG. 2G for clarity, the disclosure is not so limited, and the charge storage material 156 may include a different number of the regions 157. For example, the charge storage material 156 may comprise between one and six (e.g., one, two, three, four, five, six) of the regions 157 adjacent one another within the charge storage material 156. In embodiments including only one region 157 (e.g., a single-layer structure), the charge storage material 156 may, optionally, be formed within recessed portions vacated by end portions of the additional insulative structures 106 (FIG. 2B) prior to forming the tunnel dielectric material 116 (FIG. 2E) of the pillars 130 (FIG. 2E) within the openings 110 (FIG. 2A), as described above.

By way of non-limiting example, the first material 158 of the charge storage material 156 may be formed of and include at least one insulative material. In some embodiments, the first material 158 comprises $HfO_x$. In other embodiments, the first material 158 comprises one or more of $AlO_x$, $HfZrO_x$, $HfAlO_x$, $HfSiO_x$, $NbO_x$, $TiO_x$, $ZrO_x$, $TaO_x$, and $MgO_x$. The second material 160 may be formed of and include at least one insulative material that differs in material composition from that of the first material 158. For example, the second material 160 may be substantially (e.g., entirely) devoid of hafnium. In some embodiments, the second material 160 comprises $SiO_x$. In other embodiments, the second material 160 comprises an aluminum oxide material (e.g., $AlO_x$, Al $SiO_x$). The third material 162 may be formed of and include at least one insulative material that differs in material composition from that of each of the first material 158 and the second material 160. In some embodiments, the third material 162 comprises $TiO_x$. In other embodiments, the third material 162 comprises one or more of $HfZrO_x$, $HfAlO_x$, $HfSiO_x$, $HfZrSiO_x$, $NbO_x$, $HfO_x$, $ZrO_x$, $TaO_x$, and $MgO_x$. In some embodiments, the first material 158 comprises $HfO_2$, the second material 160 comprises $SiO_2$, and the third material 162 comprises $TiO_2$. However, the disclosure is not so limited, and the individual materials of the charge storage material 156 may include any combination of the listed materials.

One or more (e.g., each) of the first material 158, the second material 160, and the third material 162 of the charge storage material 156 may comprise an amorphous material. In some embodiments, one or more (e.g., each) of the insulative material 112 (FIG. 1E), the channel material 114 (FIG. 1E), and the tunnel dielectric material 116 (FIG. 1E) of the pillars 130 (FIG. 1E) may comprise an amorphous material, such that the charge storage material 156 and the pillars 130 are substantially (e.g., entirely) devoid of crystalline materials. In some embodiments, one or more materials of the charge storage material 156 (e.g., the second material 160) comprises amorphous silicon and the channel material 114 comprises amorphous IGZO. Since the materials of the charge storage material 156 and the materials of the pillars 130 comprise amorphous materials, high-temperature annealing processes are not utilized, which may facilitate improved performance, reliability, and durability of the electronic device 100'.

FIG. 2H illustrates an enlarged portion of the charge storage material 156 of FIG. 2E. As shown in FIG. 2H, the illustrated portion of the charge storage material 156 includes a portion of the second material 160 interposed (e.g., sandwiched) between a portion of the first material 158 and a portion of the third material 162. During operation of the electronic device 100', the second material 160 (e.g., Sift) may be configured as a so-called "switching material" between the high-k dielectric material (e.g., $HfO_2$) of the first material 158 and the dipole modulation material (e.g., $TiO_2$) of the third material 162.

As shown in FIG. 2H, the first material 158 may be in direct physical contact with the second material 160 along an interface 168 (e.g., a single interface), which interface 168 extends along and defines a boundary between the first material 158 and the second material 160. The third material 162 may be in direct physical contact with the second material 160 along an interface 170 (e.g., a single interface), which interface 170 extends along and defines a boundary between the third material 162 and the second material 160.

The interfaces 168, 170 may extend in a direction substantially parallel to a longitudinal axis of the pillars 130 (FIG. 2E) and substantially transverse to a major surface of the source 108 (FIG. 2E).

In some embodiments, a dielectric constant of the first material 158 (e.g., a high-k dielectric material) may be relatively greater than a dielectric constant of the second material 160. By way of non-limiting example, the dielectric constant of the second material 160 may be about 5, and the dielectric constant of the first material 158 may be about 25. Accordingly, the first material 158 may exhibit a dielectric constant that is about five times greater than that of the second material 160. In addition, a dielectric constant of the third material 162 may be relatively greater than the dielectric constant of the second material 160. Accordingly, each of the interfaces 168, 170 between the materials of the charge storage material 156 comprises a so-called "heterojunction" in that different materials are present along the respective interfaces 168, 170. Without being bound to any theory, it is believed that a difference in the dielectric constants of the materials along the interfaces 168, 170 facilitates generation of a net dipole across the respective interfaces 168, 170 during use and operation of the electronic device 100'.

Further, an oxygen area density (e.g., number of oxygen atoms per unit area) may differ among the materials of the charge storage material 156. For example, assuming an oxygen area density of the second material 160 is about 1, an oxygen area density of the third material 162 and the first material 158 may be about 1.3 and about 1.2, respectively. In other words, a ratio of the oxygen area density of the second material 160 to that of the third material 162 may be about 1:1.3, and a ratio of the oxygen area density of the second material 160 to that of the first material 158 may be about 1:1.2. Thus, each of the first material 158 and the third material 162 may be formulated and configured to exhibit a relatively greater number of oxygen atoms per unit area than that of the second material 160. The relative differences in the respective oxygen area densities may provide a so-called "oxygen relocation process" (e.g., a bidirectional oxygen relocation process) between each of the first material 158 and the third material 162 and the intervening switching material of the second material 160 along the respective interfaces 168, 170. Moreover, a direction of the interfacial dipoles may be switched (e.g., reversed) as a result of a redistribution of the oxygen atoms along the interfaces 168, 170 when a bias is applied, such that opposite dipole modulations occur under opposite electric fields. Thus, it is believed that dipole modulations occurring at the interfaces 168, 170 may be superimposed to facilitate an increased memory window (e.g., a voltage difference between threshold states of a program state and an erase state), as well as a larger capacitance versus voltage (C-V) hysteresis (e.g., a clockwise C-V hysteresis). The charge storage material 156 exhibiting a relatively large memory window (e.g., up to about 4V), as well as the reduced bias voltage (e.g., about 5V), may be desirable for electronic devices (e.g., non-volatile memory devices) utilizing a reduced power consumption within a higher density of memory array. The increased memory window may, in turn, facilitate a multi-level cell (MLC) memory device (e.g., storing two or more bits per cell). For example, the relatively large memory window may approximate voltage requirements of triple-level cells (TLC) configured to store three bits per cell or quad-level cells (QLC) configured to store four bits per cell. Thus, the charge storage material 156 may facilitate improved charge retention, resulting in improved performance, reliability, and durability of the electronic device 100'.

As shown in FIG. 2H, an individual portion (e.g., a single film) of the first material 158 may exhibit a thickness $Th_6$ (e.g., in the X-direction) that is substantially similar to a thickness $Th_7$ of an individual portion of the second material 160 and a thickness $Th_8$ of an individual portion of the third material 162, each of which may individually be within a range of from about 3 Å (Angstroms) to about 10 Å, such as from about 3 Å to about 4 Å, from about 4 Å to about 6 Å, from about 6 Å to about 8 Å, or from about 8 Å to about 10 Å. Alternatively, at least one portion of the materials of the charge storage material 156 may exhibit a thickness that differs from that of adjacent portions of the materials. For example, the individual portion of the second material 160 may exhibit the thickness $Th_7$ that is relatively greater than the thickness $Th_6$ of the individual portion of the first material 158 and the thickness $Th_8$ of the individual portion of the third material 162. In some embodiments, the thickness $Th_7$ of the individual portion of the second material 160 may be between about 5 Å to about 10 Å (e.g., about 8 Å) and the thickness $Th_6$ of the individual portion of the first material 158 and the thickness $Th_8$ of the individual portion of the third material 162 may individually be between about 3 Å to about 7 Å (e.g., about 5 Å). Further, thicknesses of individual portions of like materials of the charge storage material 156 may or may not be substantially similar to one another.

In some embodiments, the thickness $Th_8$ (FIG. 2F) of the charge storage material 156, including the series of multi-stacked materials, is about 10.8 nm, such as when the charge storage material 156 includes three of the regions 157 (FIG. 2G). In other embodiments, the thickness $Th_5$ of the charge storage material 156 is about 6 nm, such as when the charge storage material 156 includes a single (e.g., only one) region 157 of the series of multi-stacked materials. In other words, the combined thicknesses of the series of multi-stacked materials including the individual portions of the first material 158, the second material 160, and the third material 162 is encompassed within the thickness $Th_5$ of the charge storage material 156.

With reference to FIG. 2E in combination with FIG. 2H, during operation of the electronic device 100', electrical current may be applied to conductive lines (e.g., data lines), establishing a flow of electrical current (e.g., string current) through at least a portion of the conductive contact structures 135 and to the channel material 114 of the pillars 130. Individual memory cells of the strings 144 of the memory cells 146 may be accessed by biasing the conductive structures 136 (e.g., access lines) and the conductive lines as appropriate for various memory operations (e.g., read, program, erase, etc.), as will be apparent to those of ordinary skill in the art. A specific memory cell 146 corresponding to a specific one of the conductive structures 136 may be accessed by biasing the others of the conductive structures 136 to cause the channel material 114 of the pillars 130 to be electrically conductive proximal to the others of the conductive structures 136.

During a programming operation, the channel material 114 of non-selected strings 144 may be biased using a boost operation to inhibit the charge storage structures 148 of the non-selected strings 144 from being erased in memory cells 146 that are not selected for an erase operation. In a boost operation, a voltage may be applied to the channel material 114, at least in part, through capacitive coupling of the channel material 114 to an applied voltage on respective gates of individual memory cells 146. For example, a voltage may be applied to the gates, and some amount of that bias voltage (e.g., about 5V) may be transferred to the channel material 114 through coupling. The applied voltage may, for example, be a positive voltage applied to the uppermost conductive structure 136. The bias voltage may be relatively less than that utilized in conventional electronic devices that use conventional charge storage structures (e.g., charge trapping structures). By way of non-limiting example, the bias voltage may have a magnitude below about 8V (e.g., below about 4V, below about 5V, below about 6V). Accordingly, the bias voltage of the electronic device 100' may be significantly reduced, compared to that of conventional electronic devices. As a result of local charge transfer through the charge storage material 156, dipole moments may be generated at the interfaces 168, 170.

As the electrical current flows through the gate stack (e.g., the series of multi-stacked materials of the charge storage material 156) of a programmed cell, as illustrated by arrow 164, negative charges of the interfacial dipoles may accumulate proximal to the interface 170 and positive charges thereof may accumulate proximal to the interface 168. In other words, as the selected voltage (e.g., a positive voltage) is transferred from a direction of the third material 162, through the second material 160, and toward the first material 158, as shown in the first portion of the programmed cell on the left-hand side of FIG. 2H, a dipole moment points from the interface 170 to the interface 168. For the programmed cell, the dipole moment points from a direction of the third material 162 to a direction of the first material 158 when a bias is applied across the charge storage material 156, as illustrated by the arrow 164. Without being bound to any theory, it is believed that as the current flows from the conductive lines to the channel material 114, interfacial dipoles are generated along the interface 168 as a result of a difference in a number (e.g., quantity) of oxygen atoms per unit area between the second material 160 and the first material 158. In other words, interfacial dipoles may be generated proximal to (e.g., immediately adjacent to) the interface 168 without being generated throughout an entirety of the second material 160.

During an erase operation, a voltage may be applied to the gates, and some amount of that bias voltage (e.g., about 5V) may be transferred through the charge storage material 156. In some embodiments, the applied voltage may be a negative voltage, for example, applied to the uppermost conductive structure 136. As in a programming operation, the bias voltage of an erase operation may be relatively less than that utilized in conventional electronic devices that use conventional charge storage structures, which bias voltage may have a magnitude below about 8V (e.g., below about 4V, below about 5V, below about 6V). As a result of local charge transfer through the charge storage material 156, dipole moments may be generated at the interfaces 168, 170 in a direction opposite that of a programming operation.

As the electrical current flows through the gate stack of an erased cell, as illustrated by arrow 166, negative charges of the interfacial dipoles may accumulate proximal to the interface 168 and positive charges thereof may accumulate proximal to the interface 170. In other words, as the selected voltage (e.g., a negative voltage) is transferred from a direction of the first material 158, through the second material 160, and toward the third material 162, as shown in the second portion of the erased cell on the right-hand side of FIG. 2H, a dipole moment points from the interface 168 to the interface 170. For the erased cell, the dipole moment points from a direction of the first material 158 to a direction of the third material 162 when a bias is applied across the charge storage material 156, as illustrated by the arrow 166. Without being bound to any theory, it is believed that as the current flows during an erase operation, interfacial dipoles are generated along the interface 170 as a result of a difference in a number (e.g., quantity) of oxygen atoms per unit area between the second material 160 and the third material 162. The interfacial dipoles may be generated proximal to (e.g., immediately adjacent to) the interface 170 without being generated throughout the second material 160.

Accordingly, the switching mechanism of the second material 160 differs from that of ferroelectric-type switching materials, in which dipoles are aligned throughout an entirety of the switching materials. In contrast to ferroelectric materials, the charge storage material 156 according to embodiments of the disclosure comprises an interfacial dipole material that uses interfacial dipole modulation (IDM) in the individual portions of the switching material of the second material 160. Moreover, ferroelectric materials (e.g., crystalline materials) are conventionally formed at temperatures greater than about 350° C. (e.g., greater than about 550° C.) to provide a crystalline phase. Since one or more (e.g., each) of the materials of the charge storage material 156 comprise amorphous materials, high-temperature annealing processes are not utilized. Accordingly, the materials of the charge storage material 156 of the electronic device 100' are relatively less sensitive to temperature variations, compared to that of ferroelectric-type switching materials of conventional electronic devices including such materials. For example, higher applied temperatures for a given amount of time may result in the ferroelectric materials returning to a non-ferroelectric monoclinic phase, which can adversely affect electronic device performance.

Providing the materials of the charge storage material 156 may significantly reduce such defects to allow increased uniformity of a threshold voltage ($V_{TH}$) of the multi-stacked structure, while offering significantly reduced power demand, during use and operation of the electronic device 100'. Accordingly, various memory operations (e.g., program operations, erase operations) may be conducted by switching a direction of the interfacial dipoles along the interfaces 168, 170 of the materials of the charge storage material 156, without transferring electrons from a conventional charge trapping material (e.g., during a conventional erase operation) and onto the conventional charge trapping material (e.g., during a conventional program operation).

Figure 2I:
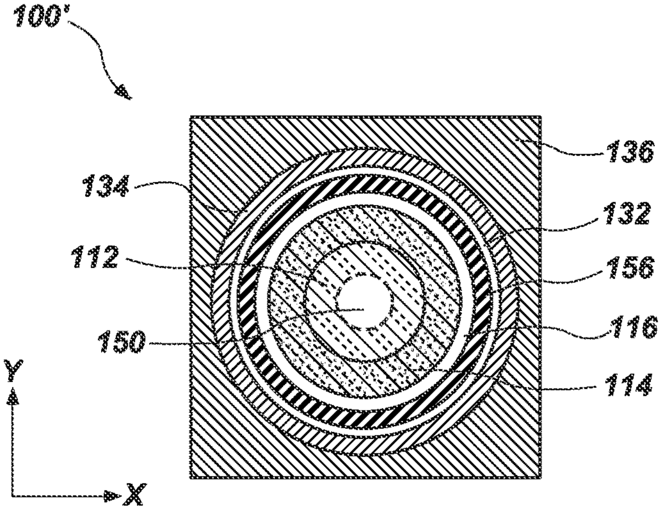
Figure 2J:
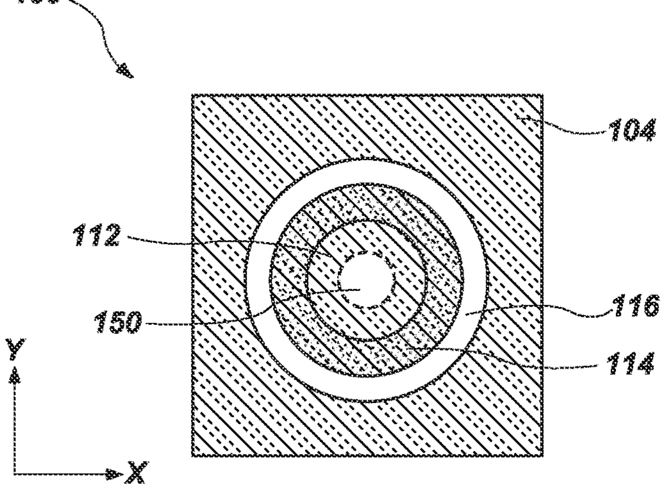

FIG. 2I illustrates a simplified partial top-down view of the electronic device 100' of FIG. 2E taken along the I-I line at a horizontal centerline of one of the conductive structures 136 of the conductive levels 138 (FIG. 2E). As best shown in the top-down view of FIG. 2I, the conductive liner material 134, if present, is horizontally adjacent to the conductive structures 136, the dielectric barrier material 132, if present, is horizontally adjacent to the conductive liner material 134, and the charge storage material 156 is horizontally adjacent to the dielectric barrier material 132. In addition, the tunnel dielectric material 116 is horizontally adjacent to the charge storage material 156, the channel material 114 is horizontally adjacent to the tunnel dielectric material 116 and the insulative material 112 is horizontally adjacent to and substantially surrounded by the channel material 114. One or more of the air gaps 150 may, optionally, be partially defined by portions of the insulative material 112.

With reference to FIG. 2E in combination with FIG. 2I, the charge storage material 156 may be in direct physical contact with and substantially surround (e.g., substantially continuously surround) the tunnel dielectric material 116 of the individual pillars 130 at the conductive levels 138 including the conductive structures 136, without surrounding the tunnel dielectric material 116 at individual levels of the insulative structures 104, as shown in FIG. 2E. Accordingly, the charge storage material 156 may substantially surround the pillars 130 in at least one horizontal direction (e.g., the X-direction, the Y-direction).

FIG. 2J illustrates a simplified partial top-down view of the electronic device 100' of FIG. 2E taken along the J-J line at a horizontal centerline of one of the insulative structures 104 of the stack 141 (FIG. 2E). As best shown in the top-down view of FIG. 2J, the tunnel dielectric material 116 is horizontally adjacent to the insulative structures 104, the channel material 114 is horizontally adjacent to the tunnel dielectric material 116, and the insulative material 112 is horizontally adjacent to the channel material 114. One or more of the air gaps 150 may, optionally, be partially defined by portions of the insulative material 112. However, and in contrast to the top-down view in FIG. 2I, no charge storage material 156 is horizontally adjacent to the insulative structures 104.

With reference to FIG. 2E in combination with FIG. 2J, the tunnel dielectric material 116 may be in direct physical contact with and substantially surround (e.g., substantially continuously surround) the channel material 114 at levels (e.g., elevations) of the insulative structures 104, as shown in FIG. 2E. The insulative structures 104 may be in direct physical contact with and substantially surround (e.g., substantially continuously surround) the tunnel dielectric material 116 at levels of the insulative structures 104, without additional materials (e.g., the charge storage material 156) being formed therebetween.

Thus, in accordance with further embodiments of the disclosure, an electronic device comprises a stack comprising tiers of alternating conductive structures and insulative structures, and pillars vertically extending through the stack. The pillars comprise a tunnel dielectric material directly adjacent to the insulative structures of the stack. The electronic device comprises a charge storage material horizontally adjacent to the conductive structures of the stack. The charge storage material comprises a multi-stacked structure comprising one or more regions of a first insulative material, a second insulative material horizontally adjacent to the first insulative material, and a third insulative material horizontally adjacent to the second insulative material. A material composition of the second insulative material differs from a material composition of each of the first insulative material and the third insulative material.

By way of non-limiting example, one or more of the electronic devices 100, 100' may operate as FLASH memory configured as a not-and (NAND), dynamic random access memory (DRAM), not-or (NOR), or 3D XPoint memory device. Such configurations may facilitate a higher density of the memory array relative to conventional DRAM memory and a reduction in power consumption, as well as a reduction in operational speed (e.g., programming time), relative to conventional 3D NAND Flash memory. Given the reduced power consumption within a higher density of memory array, the electronic devices 100, 100' may also be configured as memory devices for use in one or more neural networks (e.g., an artificial neural network (ANN), a deep neural network (DNN), a convolutional deep neural networks (CNN), a long short term memory neural network (LSTM)) that use artificial neurons computing outputs via a dot product operation.

Figure 3:
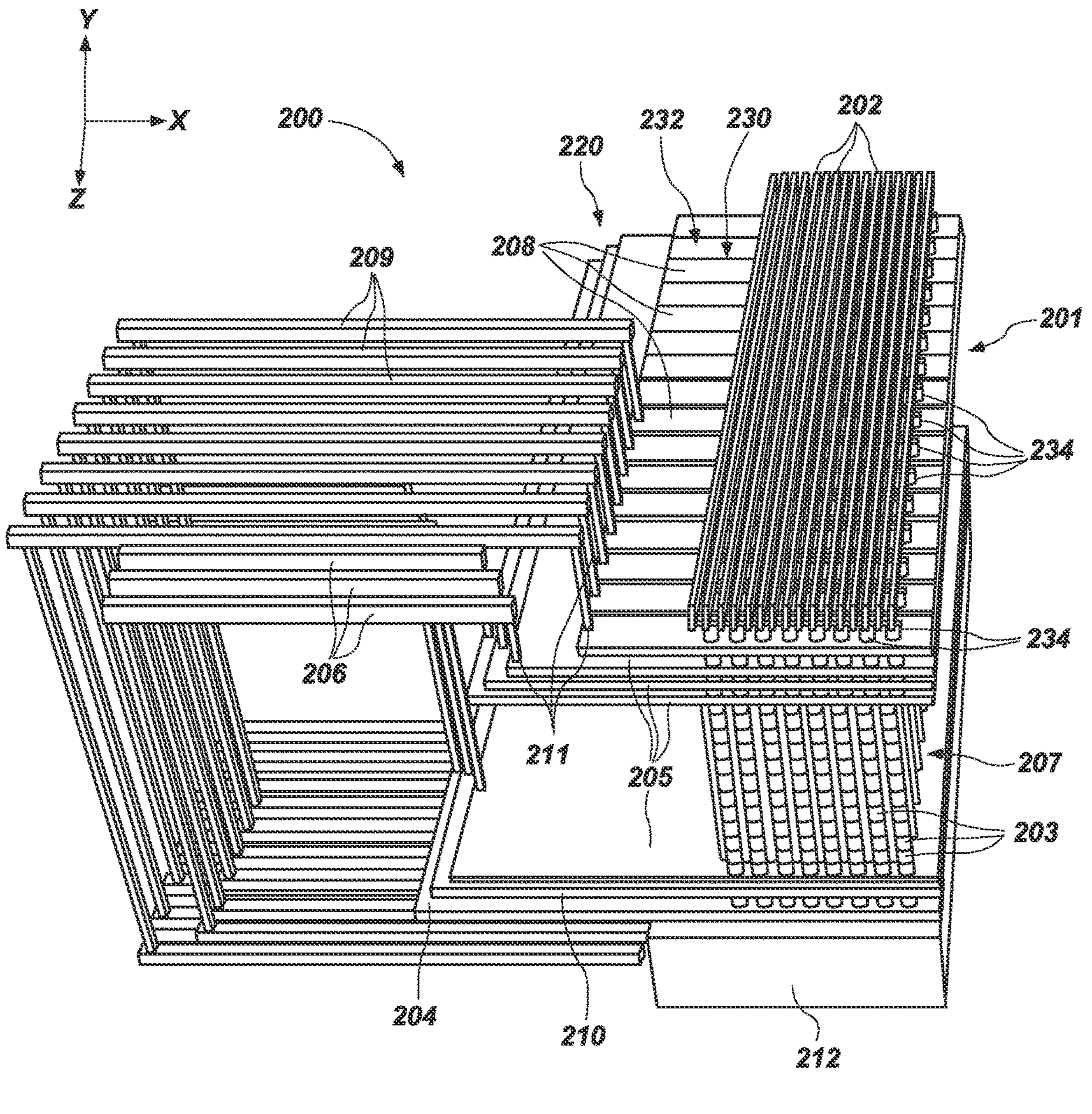
FIG. 3 is a partial cutaway perspective view of an electronic device, in accordance with embodiments of the disclosure.

FIG. 3 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may be substantially similar to one of the electronic devices 100, 100' previously described with reference to FIGS. 1A through 1K and FIGS. 2A through 2J. As shown in FIG. 3, the electronic device structure 201 of the electronic device 200 may include a staircase structure 220 defining contact regions for connecting interconnect lines 206 to conductive structures 205 (e.g., corresponding to the conductive structures 136 (FIGS. 1E and 2E)). The electronic device structure 201 may include vertical strings 207 (e.g., corresponding to the strings 144 (FIGS. 1E and 2E)) of memory cells 203 (e.g., corresponding to the memory cells 146 (FIGS. 1E and 2E)) that are coupled to each other in series. The vertical strings 207 may extend vertically (e.g., in the Z-direction) and orthogonally to conductive lines and the conductive structures 205, such as data lines 202, a source tier 204 (e.g., including the source 108 (FIGS. 1E and 2E)), the interconnect lines 206, first select gates 208 (e.g., upper select gates, drain select gates (SGDs)), select lines 209, and a second select gate 210 (e.g., a lower select gate, a source select gate (SGS)). The select gates 208 may be horizontally divided (e.g., in the Y-direction) into multiple blocks 232 (e.g., blocks 124, 126 (FIGS. 1E and 2E)) horizontally separated (e.g., in the Y-direction) from one another by slots 230 (e.g., the insulative material 140 (FIGS. 1E and 2E) formed within the slots 122 (FIGS. 1D and 2D)).

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual group of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word line plates) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205.

The data lines 202 may be electrically coupled to the vertical strings 207 through conductive contact structures 234 (e.g., corresponding to the conductive contact structures 135 (FIGS. 1E and 2E)).

Thus, in accordance with additional embodiments of the disclosure, a memory device comprises a stack comprising alternating conductive structures and insulative structures arranged in tiers. Each tier individually comprises a conductive structure and an insulative structure. The memory device comprises strings of memory cells vertically extending through the stack. The strings of memory cells comprise a channel material vertically extending through the stack and a tunnel material vertically extending through the stack. The memory device comprises a memory material separating vertically neighboring conductive structures. Individual portions of the memory material are laterally adjacent to the tunnel material and a respective conductive structure. The memory device comprises a dielectric blocking material laterally adjacent to the conductive structures of the stack.

Figure 4:
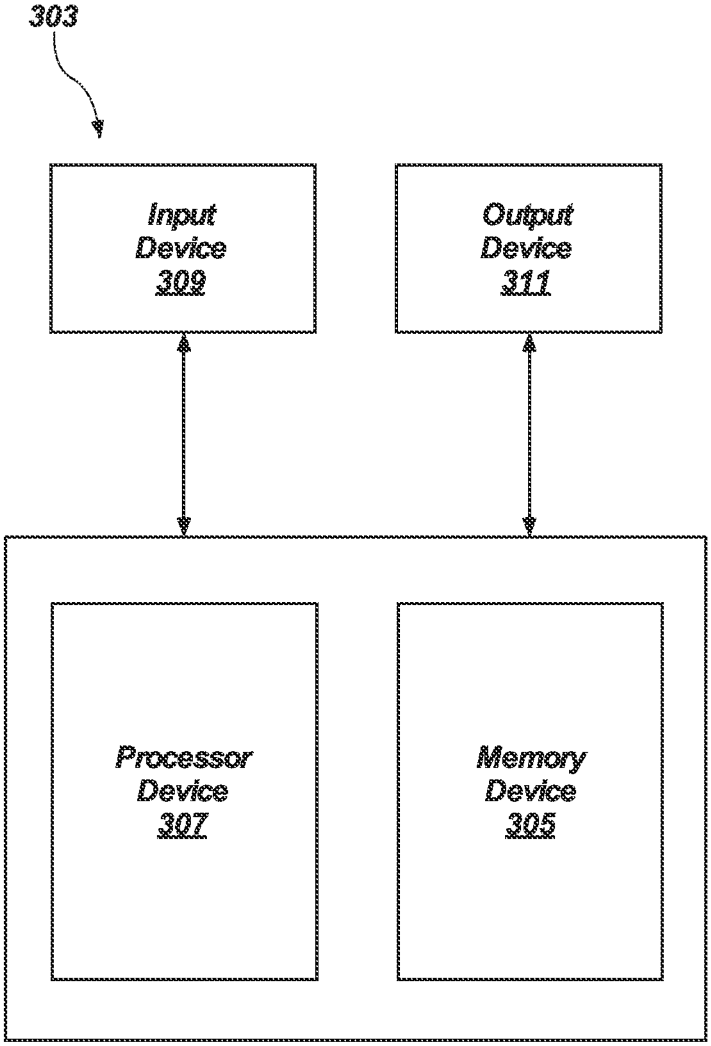
FIG. 4 is a block diagram of an electronic system, in accordance with embodiments of the disclosure.

Electronic devices including one or more of the electronic devices 100, 100', 200 including the memory material (e.g., charge trapping material, charge storage material) of charge storage structures, according to embodiments of the disclosure, may be used in embodiments of electronic systems of the disclosure. For example, FIG. 4 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device previously described herein (e.g., the electronic devices 100, 100', 200 previously described with reference to FIGS. 1A through 1K, FIGS. 2A through 2J, and FIG. 3) including the memory material of charge storage structures.

The electronic system 303 may further include at least one electronic signal processor device 307 (often referred to as a "microprocessor"). The electronic signal processor device 307 may optionally include an embodiment of an electronic device previously described herein (e.g., one or more of the electronic devices 100, 100', 200 previously described with reference to FIGS. 1A through 1K, FIGS. 2A through 2J, and FIG. 3). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 5:
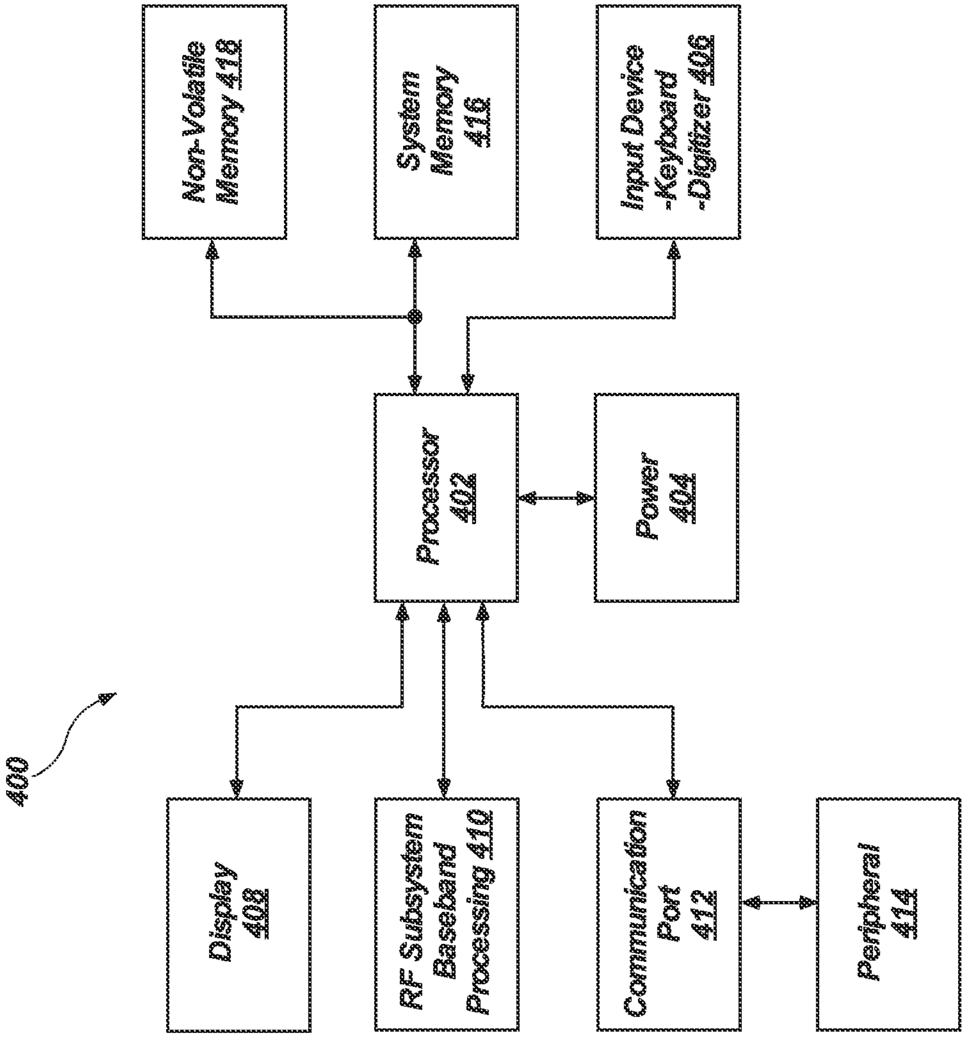
FIG. 5 is a block diagram of a processor-based system, in accordance with embodiments of the disclosure.

With reference to FIG. 5, depicted is a processor-based system 400. The processor-based system 400 may include various electronic devices (e.g., one or more of the electronic devices 100, 100', 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., one or more of the electronic devices 100, 100', 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., one or more of the electronic devices 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., one or more of the electronic devices 100, 100', 200) described above, or a combination thereof.

Accordingly, in at least some embodiments, a system comprises a processor operably coupled to an input device and an output device, and an electronic device operably coupled to the processor. The electronic device comprises strings of memory cells vertically extending through a stack comprising vertically alternating sequences of insulative structures and conductive structures arranged in tiers, and a charge storage structure circumferentially surrounding at least some of the strings of memory cells. The charge storage structure comprises a tunnel material vertically extending through the stack and discontinuous portions of a charge storage material in horizontal alignment with the tunnel dielectric material and a respective conductive structure of the stack.

The electronic devices and systems of the disclosure advantageously facilitate one or more of improved simplicity, greater memory density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater memory density as compared to conventional devices (e.g., conventional apparatuses, conventional microelectronic devices, conventional memory devices) and conventional systems (e.g., conventional electronic systems). By providing the memory material or, alternatively, the charge storage material within the electronic devices and systems, such configurations may allow for improved density as memory devices are scaled down in size to increase the density of memory cells, which improved density may result in reduced power consumption during use and operation. Such a configuration may result in electronic devices and systems exhibiting improved performance, reliability, and durability.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:

a stack comprising tiers of alternating conductive structures and insulative structures;

pillars vertically extending through the stack, the pillars comprising a tunnel dielectric material, a channel material, and an insulative material, the insulative material substantially surrounded by the channel material;

a memory material horizontally adjacent to the conductive structures without being horizontally adjacent to the insulative structures, the memory material comprising crystalline nanoparticles embedded within a high-k dielectric material comprising one or more of hafnium zirconium oxide and zirconium oxide; and conductive contact structures substantially surrounded by the channel material and vertically adjacent to the insulative material.

2. The electronic device of claim 1, further comprising a dielectric blocking material horizontally adjacent to the memory material, wherein portions of the memory material are vertically adjacent to the insulative structures of the stack and portions of the dielectric blocking material are vertically adjacent to the memory material.

3. The electronic device of claim 1, further comprising one or more of a high-k dielectric material and a conductive liner material between the alternating conductive structures and insulative structures of the stack, wherein the high-k dielectric material and the conductive liner material are vertically and horizontally interposed between the conductive structures and the memory material.

4. The electronic device of claim 1, further comprising one or more air gaps within a central portion of the pillars, at least some of the air gaps horizontally interposed between portions of the channel material of the pillars.

5. The electronic device of claim 1, wherein the tunnel dielectric material is directly adjacent to the memory material and the insulative structures of the stack.

6. The electronic device of claim 1, wherein the pillars comprise a dielectric blocking material directly between the memory material and the tunnel dielectric material, the dielectric blocking material extending substantially continuously along a height of the pillars, and the memory material comprising segmented portions at levels of the conductive structures of the stack.

7. An electronic device, comprising:

a stack comprising tiers of alternating conductive structures and insulative structures;

pillars vertically extending through the stack, the pillars comprising a tunnel dielectric material directly adjacent to the insulative structures of the stack; and a charge storage material horizontally adjacent to the conductive structures of the stack, the charge storage material comprising a multi-stacked structure comprising one or more regions of a first insulative material, a second insulative material directly horizontally adjacent to the first insulative material, and a third insulative material directly horizontally adjacent to the second insulative material, a material composition of the second insulative material differing from a material composition of each of the first insulative material and the third insulative material, wherein the first insulative material comprises a high-k dielectric material, the second insulative material comprises a switching material, and the third insulative material comprises a dipole modulation material.

8. The electronic device of claim 7, wherein the charge storage material substantially surrounds the tunnel dielectric material of the pillars at individual levels of the conductive structures without surrounding the tunnel dielectric material at individual levels of the insulative structures.

9. The electronic device of claim 7, wherein upper surfaces and lower surfaces of the charge storage material directly contact the insulative structures of the stack, interfaces between the first insulative material, the second insulative material, and the third insulative material extending in a direction substantially parallel to a longitudinal axis of the pillars.

10. The electronic device of claim 7, wherein the pillars comprise an amorphous channel material horizontally adjacent to the tunnel dielectric material, each of the first insulative material, the second insulative material, and the third insulative material individually comprising an amorphous material.

11. The electronic device of claim 7, wherein:

the first insulative material comprises a hafnium oxide material directly horizontally adjacent to a silicon dioxide material of the tunnel dielectric material of the pillars;

the second insulative material comprises a silicon dioxide material directly horizontally adjacent to each of the first insulative material and the third insulative material; and the third insulative material comprises a titanium oxide material horizontally interposed between the second insulative material and the conductive structures of the stack.

12. A memory device, comprising:

a stack comprising alternating conductive structures and insulative structures arranged in tiers, each tier individually comprising a conductive structure and an insulative structure;

strings of memory cells vertically extending through the stack, the strings of memory cells comprising a channel material vertically extending through the stack and a tunnel material vertically extending through the stack, wherein the channel material is laterally adjacent to conductive contact structures;

a memory material comprising ruthenium nanoparticles in an oxide material comprising zirconium, the memory material separating vertically neighboring conductive structures, individual portions of the memory material laterally adjacent to the tunnel material and a respective conductive structure; and a dielectric blocking material laterally adjacent to the conductive structures of the stack.

13. The memory device of claim 12, wherein the memory material includes upper portions and lower portions separated from one another by the conductive structures.

14. The memory device of claim 12, further comprising an insulative material between adjacent blocks of the stack, the insulative material directly contacting the memory material.

15. The memory device of claim 12, wherein the ruthenium nanoparticles are isolated from the tunnel material by the oxide material.

16. The memory device of claim 12, wherein the tunnel material, the memory material, and the dielectric blocking material are configured as a charge storage structure, the tunnel material comprising a thickness within a range of from about 0.5 nm to about 2 nm, and the charge storage structure comprising a total thickness within a range of from about 5 nm to about 7 nm.

17. A system, comprising:

a processor operably coupled to an input device and an output device; and an electronic device operably coupled to the processor, the electronic device comprising:

strings of memory cells vertically extending through a stack comprising vertically alternating sequences of insulative structures and conductive structures arranged in tiers;

a charge storage structure circumferentially surrounding at least some of the strings of memory cells, the charge storage structure comprising a tunnel dielectric material vertically extending through the stack and discontinuous portions of a charge storage material comprising ruthenium nanoparticles embedded in hafnium zirconium oxide in horizontal alignment with the tunnel dielectric material and a respective conductive structure of the stack; and conductive contact structures in horizontal alignment with portions of a channel material, the channel material extending through the stack.

18. The system of claim 17, wherein at least some memory cells of the strings of memory cells are configured as multi-level cells (MLC).

19. The system of claim 17, wherein the tunnel dielectric material comprises one or more of hafnium silicon dioxide and silicon dioxide, and the charge storage material further comprises one or more of hafnium dioxide, silicon dioxide, and titanium dioxide.

20. The system of claim 17, wherein the ruthenium nanoparticles comprise crystalline nanoparticles, the charge storage material directly adjacent to the insulative structures.

21. The system of claim 17, wherein the electronic device comprises a 3D NAND Flash memory device comprising at least one memory array and a CMOS under array (CUA) region under the at least one memory array.

22. The electronic device of claim 7, wherein a ratio of an oxygen area density of the second insulative material to an oxygen area density of the third insulative material is about 1:1.3, and the ratio of the oxygen area density of the second insulative material to an oxygen area density the first insulative material is about 1:1.2.

* * * * *